(12) United States Patent
Jeon et al.

(10) Patent No.: US 10,573,701 B2
(45) Date of Patent: Feb. 25, 2020

(54) ORGANIC LIGHT EMITTING DISPLAY DEVICE HAVING HIGH DIELECTRIC CONSTANT INSULATION LAYER

(71) Applicant: Samsung Display Co., Ltd., Yongin-Si, Gyeonggi-Do (KR)

(72) Inventors: Woo-Seok Jeon, Seoul (KR); Byeong-Beom Kim, Asan-si (KR); Chulmin Bae, Hwaseong-si (KR); Jinho Hwang, Osan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/185,492

(22) Filed: Nov. 9, 2018

(65) Prior Publication Data

US 2019/0148472 A1 May 16, 2019

(30) Foreign Application Priority Data

Nov. 16, 2017 (KR) ......................... 10-2017-0153418

(51) Int. Cl.
*H01L 27/32* (2006.01)
*H01L 27/12* (2006.01)

(52) U.S. Cl.
CPC ...... *H01L 27/3265* (2013.01); *H01L 27/1255* (2013.01); *H01L 2227/323* (2013.01)

(58) Field of Classification Search
CPC .............................. H01L 27/02; H01L 27/32
See application file for complete search history.

(56) References Cited

U.S. PATENT DOCUMENTS

| 8,815,695 B2 | 8/2014 | Rui et al. | |
| 2007/0257250 A1* | 11/2007 | Tseng | H01L 27/3269 257/40 |
| 2013/0043545 A1 | 2/2013 | Lee et al. | |
| 2013/0334511 A1* | 12/2013 | Savas | H01L 51/56 257/40 |

FOREIGN PATENT DOCUMENTS

| KR | 1020050050003 A | 5/2005 |
| KR | 100668827 B1 | 1/2007 |

OTHER PUBLICATIONS

Cho, et al., New TIT capacitor with ZrO2/Al2O3/ZrO2 dielectrics for 60 nm and below DRAMs, ScienceDirect, Solid-State Electronics vol. 51 (2007) pp. 1529-1533.

* cited by examiner

*Primary Examiner* — Quoc D Hoang
(74) *Attorney, Agent, or Firm* — Cantor Colburn LLP

(57) ABSTRACT

An organic light emitting display device includes a substrate, an active layer, a gate electrode, a first high dielectric constant (hereinafter "high-k") insulation structure, source and drain electrodes, and a light emitting structure. The active layer is disposed on the substrate. The gate electrode is disposed on the active layer. The first high-k insulation structure is disposed on the gate electrode and includes a carbon-doped first high-k insulation layer and a first ammonia layer on the carbon-doped first high-k insulation layer. The source and drain electrodes are disposed on the first high-k insulation structure and constitute a semiconductor element together with the active layer and the gate electrode. The light emitting structure is disposed on the source and drain electrodes.

20 Claims, 23 Drawing Sheets

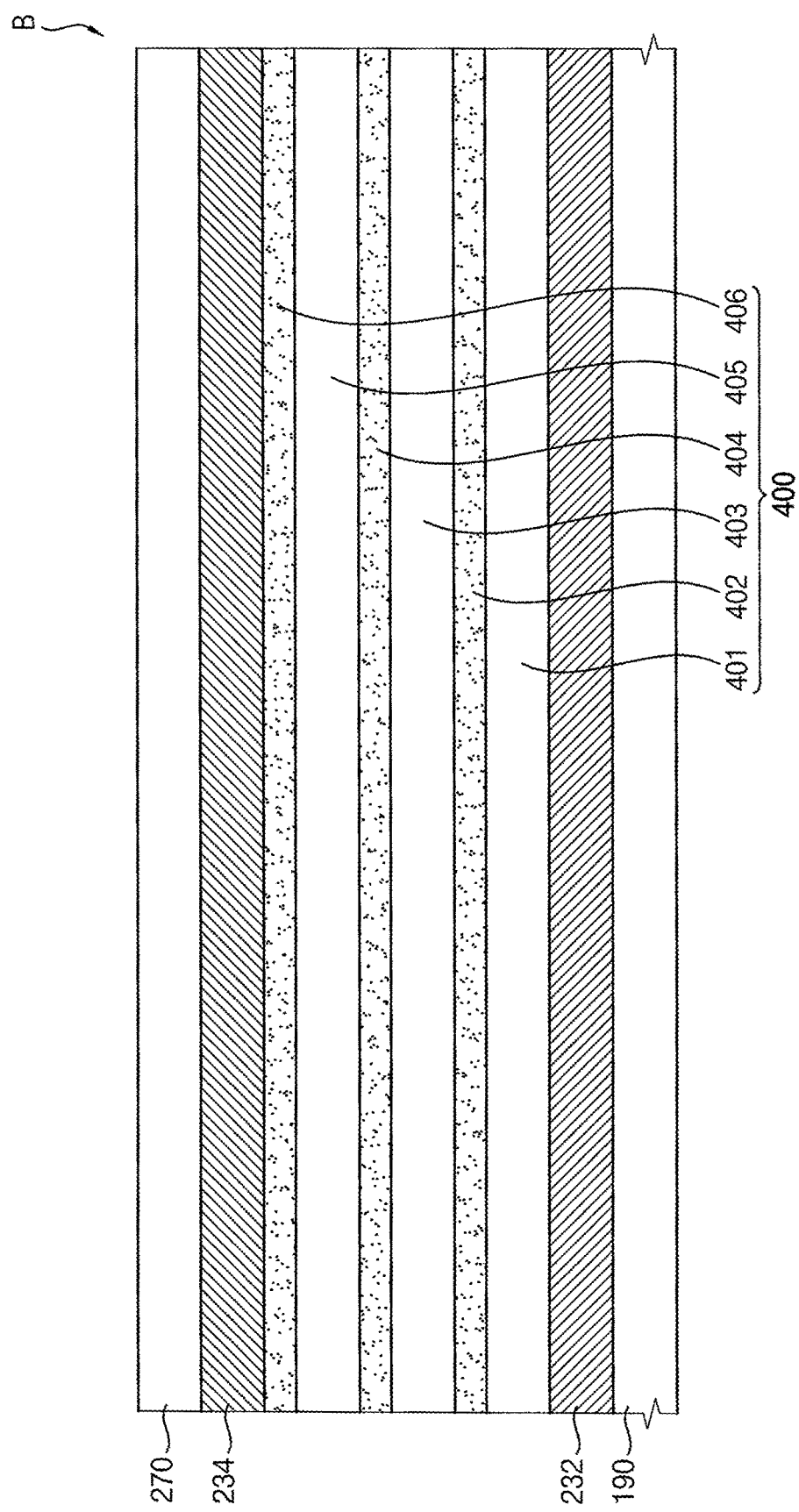

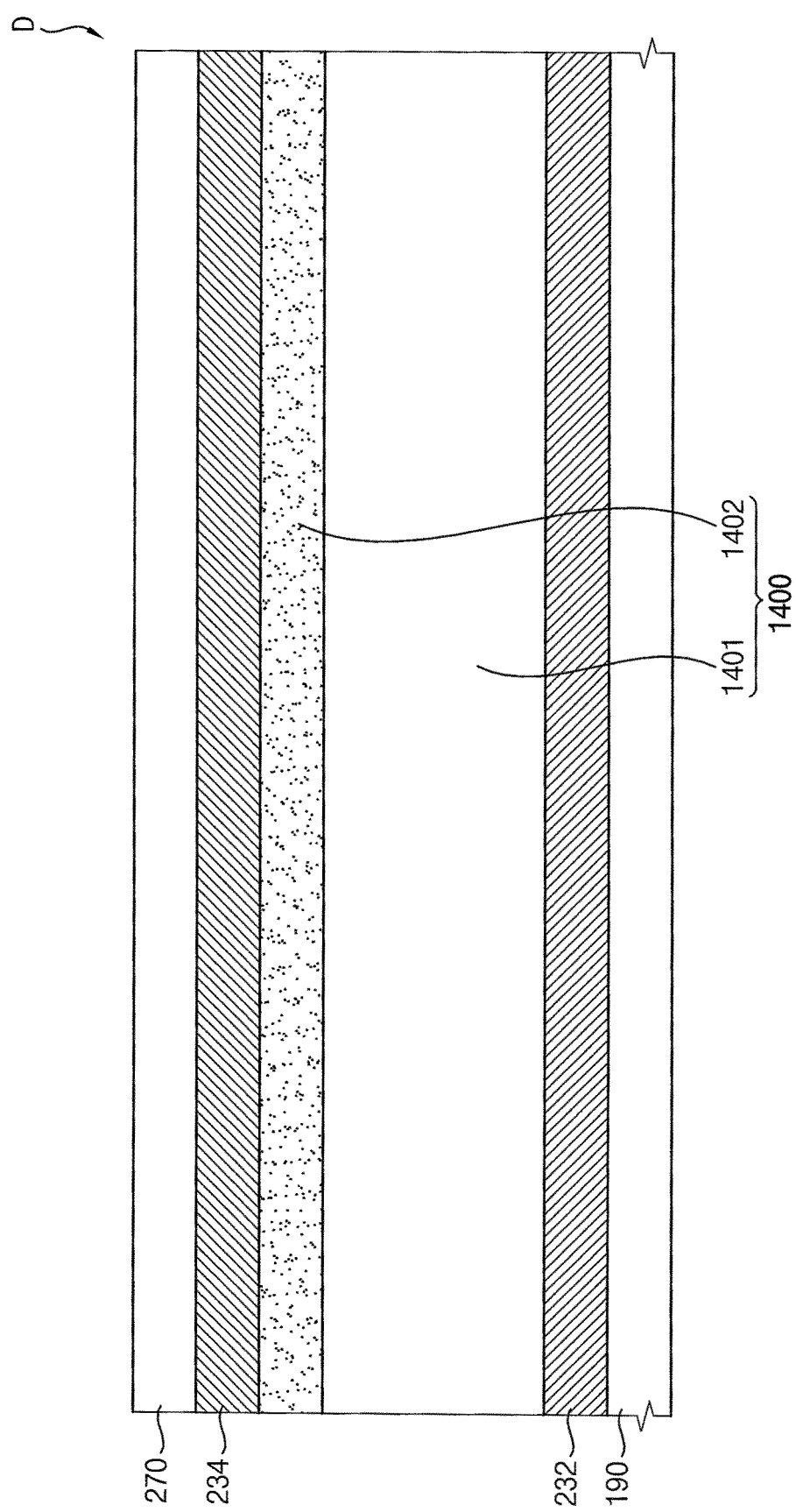

ORGANIC LIGHT EMITTING DISPLAY DEVICE HAVING HIGH DIELECTRIC CONSTANT INSULATION LAYER

This application claims priority to Korean Patent Applications No. 10-2017-0153418, filed on Nov. 16, 2017, under 35 USC § 119, the content of which in its entirety is herein incorporated by reference.

BACKGROUND

1. Field

Exemplary embodiments relate generally to an organic light emitting display device. More particularly, exemplary embodiments of the inventive concept relate to an organic light emitting display device including a high dielectric constant insulation structure.

2. Description of the Related Art

A flat panel display ("FPD") device is widely used as a display device of an electronic device because the FPD device is lightweight and thin compared to a cathode-ray tube ("CRT") display device. Typical examples of the FPD device are a liquid crystal display ("LCD") device and an organic light emitting display ("OLED") device.

An OLED device, which has a high-resolution and/or a high-brightness, capable of being driven at high speed and/or low frequency using a high dielectric constant (hereinafter "high-k") insulation layer has been developed. The high-k insulation layer may be used as a dielectric layer of a capacitor included in the OLED device.

SUMMARY

When the high dielectric constant (hereinafter "high-k") insulation layer is manufactured as a relatively large thickness according to a type of a capacitor included in the OLED device, a metal oxide, which is an ingredient or a component material of the dielectric layer, may be crystallized, and thus a leakage current of the capacitor may increase. In addition, since the high-k insulation layer has a relatively large bond energy, it is difficult that a dry etch process is performed.

Some exemplary embodiments provide an organic light emitting display device including a high dielectric constant insulation structure.

According to some exemplary embodiments, an organic light emitting display ("OLED") device includes a substrate, an active layer, a gate electrode, a first high-k insulation structure, source and drain electrodes, and a light emitting structure. The active layer is disposed on the substrate. The gate electrode is disposed on the active layer. The first high-k insulation structure is disposed on the gate electrode and includes a carbon-doped first high-k insulation layer and a first ammonia layer on the carbon-doped first high-k insulation layer. The source and drain electrodes are disposed on the first high-k insulation structure and constitute a semiconductor element together with the active layer and the gate electrode. The light emitting structure is disposed on the source and drain electrodes.

In some exemplary embodiments, the first high-k insulation structure may have a multi-layered structure including at least two of the carbon-doped first high-k insulation layers and at least two of the first ammonia layers.

In some exemplary embodiments, the carbon-doped first high-k insulation layer and the first ammonia layer may be alternately and repeatedly disposed.

In some exemplary embodiments, a thickness of the carbon-doped first high-k insulation layer may be greater than a thickness of the first ammonia layer.

In some exemplary embodiments, a thickness of the first high-k insulation structure may be equal to or greater than about 100 nanometers, and a thickness of the first ammonia layer may be less than or equal to about 20 nanometers.

In some exemplary embodiments, the carbon-doped first high-k insulation layer may include a carbon-doped amorphous metal oxide.

In some exemplary embodiments, the carbon-doped first high-k insulation layer may consist essentially of a carbon-doped amorphous zirconium oxide.

In some exemplary embodiments, the OLED device may further include a first gate electrode pattern and a second gate electrode pattern. The first gate electrode pattern may be spaced apart from the gate electrode and may be disposed at the same level with the gate electrode. The second gate electrode pattern may overlap the first gate electrode pattern in a plan view and may constitute a first capacitor together with the first gate electrode pattern and the first high-k insulation structure.

In some exemplary embodiments, the first high-k insulation structure may be disposed between the first and second gate electrode patterns.

In some exemplary embodiments, the OLED device may further include a gate insulation layer disposed between the active layer and the gate electrode and an insulating interlayer disposed on the second gate electrode pattern.

In some exemplary embodiments, the OLED device may further include a first electrode pattern, a second electrode pattern, and a second high-k insulation structure. The first electrode pattern may be spaced apart from the source and drain electrodes and may be disposed at the same level with the source and drain electrodes. The second electrode pattern may overlap the first electrode pattern in a plan view. The second high-k insulation structure may be disposed between the first and second electrode patterns and may include a carbon-doped second high-k insulation layer and a second ammonia layer disposed on the carbon-doped second high-k insulation layer. The second electrode pattern may constitute a second capacitor together with the first electrode pattern and the second high-k insulation structure.

In some exemplary embodiments, the second high-k insulation structure may have a multi-layered structure including at least two of the carbon-doped second high-k insulation layers and at least two of the second ammonia layers. The carbon-doped second high-k insulation layer and the second ammonia layer may be alternately and repeatedly disposed.

In some exemplary embodiments, a thickness of the carbon-doped second high-k insulation layer may be greater than a thickness of the second ammonia layer, and the carbon-doped second high-k insulation layer may consist essentially of a carbon-doped amorphous zirconium oxide.

In some exemplary embodiments, the light emitting structure may include a lower electrode disposed on the semiconductor element, a light emitting layer disposed on the lower electrode, and an upper electrode disposed on the light emitting layer.

According to some exemplary embodiments, an OLED device includes a substrate, an active layer, a gate electrode, a first high-k insulation structure, source and drain electrodes, and a light emitting structure. The active layer is disposed on the substrate. The gate electrode is disposed on the active layer. The first high-k insulation structure is disposed on the gate electrode and includes a carbon-doped first high-k insulation layer and a first insulation layer. The first insulation layer is disposed on the carbon-doped first high-k insulation layer and has a dielectric constant less than a dielectric constant of the carbon-doped first high-k insulation layer. The source and drain electrodes are disposed on the first high-k insulation structure and constitute a semiconductor element together with the active layer and the gate electrode. The light emitting structure is disposed on the source and drain electrodes.

In some exemplary embodiments, a thickness of the carbon-doped first high-k insulation layer may be greater than a thickness of the first insulation layer.

In some exemplary embodiments, the carbon-doped first high-k insulation layer may consist essentially of a carbon-doped amorphous zirconium oxide.

In some exemplary embodiments, the OLED device may further include a first gate electrode pattern and a second gate electrode pattern. The first gate electrode pattern may be spaced apart from the gate electrode and may be disposed at the same level with the gate electrode. The second gate electrode pattern may overlap the first gate electrode pattern in a plan view and may constitute a first capacitor together with the first gate electrode pattern and the first high-k insulation structure. The first high-k insulation structure may be disposed between the first and second gate electrode patterns.

In some exemplary embodiments, the OLED device may further include a gate insulation layer disposed between the active layer and the gate electrode and an insulating interlayer disposed on the second gate electrode pattern.

In some exemplary embodiments, the OLED device may further include a first electrode pattern, a second electrode pattern, and a second high-k insulation structure. The first electrode pattern may be spaced apart from the source and drain electrodes and may be disposed at the same level with the source and drain electrodes. The second electrode pattern may overlap the first electrode pattern in a plan view. The second high-k insulation structure may be disposed between the first and second electrode patterns and may include a carbon-doped second high-k insulation layer and a second insulation layer. The second insulation layer may be disposed on the carbon-doped second high-k insulation layer and may have a dielectric constant less than a dielectric constant of the carbon-doped second high-k insulation layer. The second electrode pattern constitutes a second capacitor together with the first electrode pattern and the second high-k insulation structure.

Since the OLED device in accordance with exemplary embodiments includes the first and second high-k insulation structures having a high dielectric constant and a relatively large thickness, a breakdown voltage characteristic of the first and second capacitors may relatively improve, and a leakage current of the first and second capacitors may reduce. In addition, since the first and second high-k insulation structures have a relatively large thickness, the first and second capacitors may not be shorted. Further, a dry etch process may be readily performed to remove the first and second high-k insulation structures since an ingredient included in the first and second high-k insulation structures has a relatively small bond energy.

Since the OLED device in accordance with exemplary embodiments includes the first and second high-k insulation structures having a relatively high breakdown voltage and a relatively large thickness, the first and second capacitors may be relatively less affected by the high voltage although a wiring where a high voltage is applied is disposed around the first and second capacitors.

BRIEF DESCRIPTION OF THE DRAWINGS

Exemplary embodiments can be understood in more detail from the following description taken in conjunction with the accompanying drawings, in which:

FIG. 3 is an enlarged cross-sectional view corresponding to region 'B' of FIG. 1;

FIG. 21 is an enlarged cross-sectional view corresponding to region 'D' of FIG. 19.

DETAILED DESCRIPTION

Figure 1:
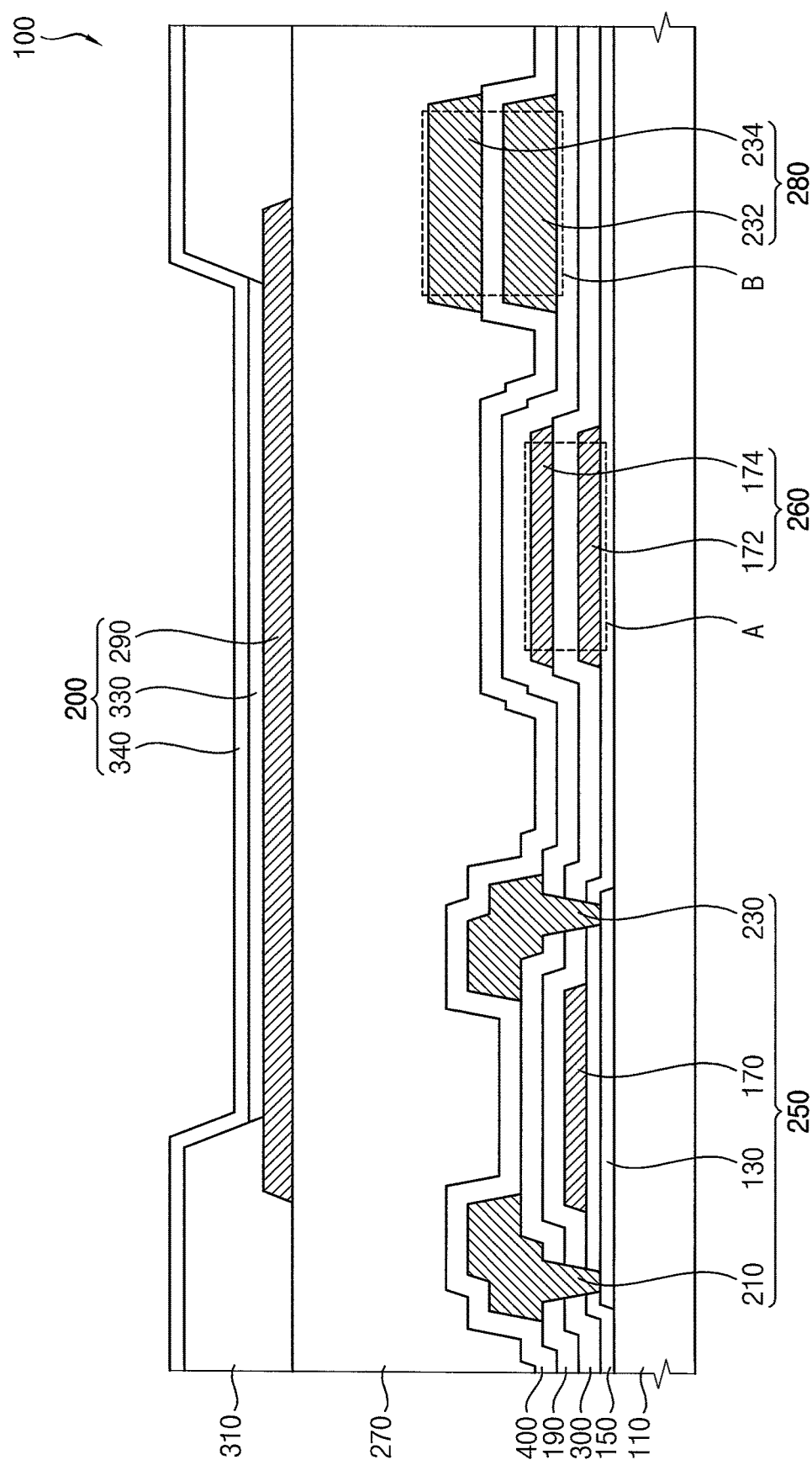
FIG. 1 is a cross sectional view illustrating an exemplary embodiment of an organic light emitting display ("OLED") device in accordance with the invention.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Hereinafter, embodiments of the inventive concept will be explained in detail with reference to the accompanying drawings.

Figure 2:
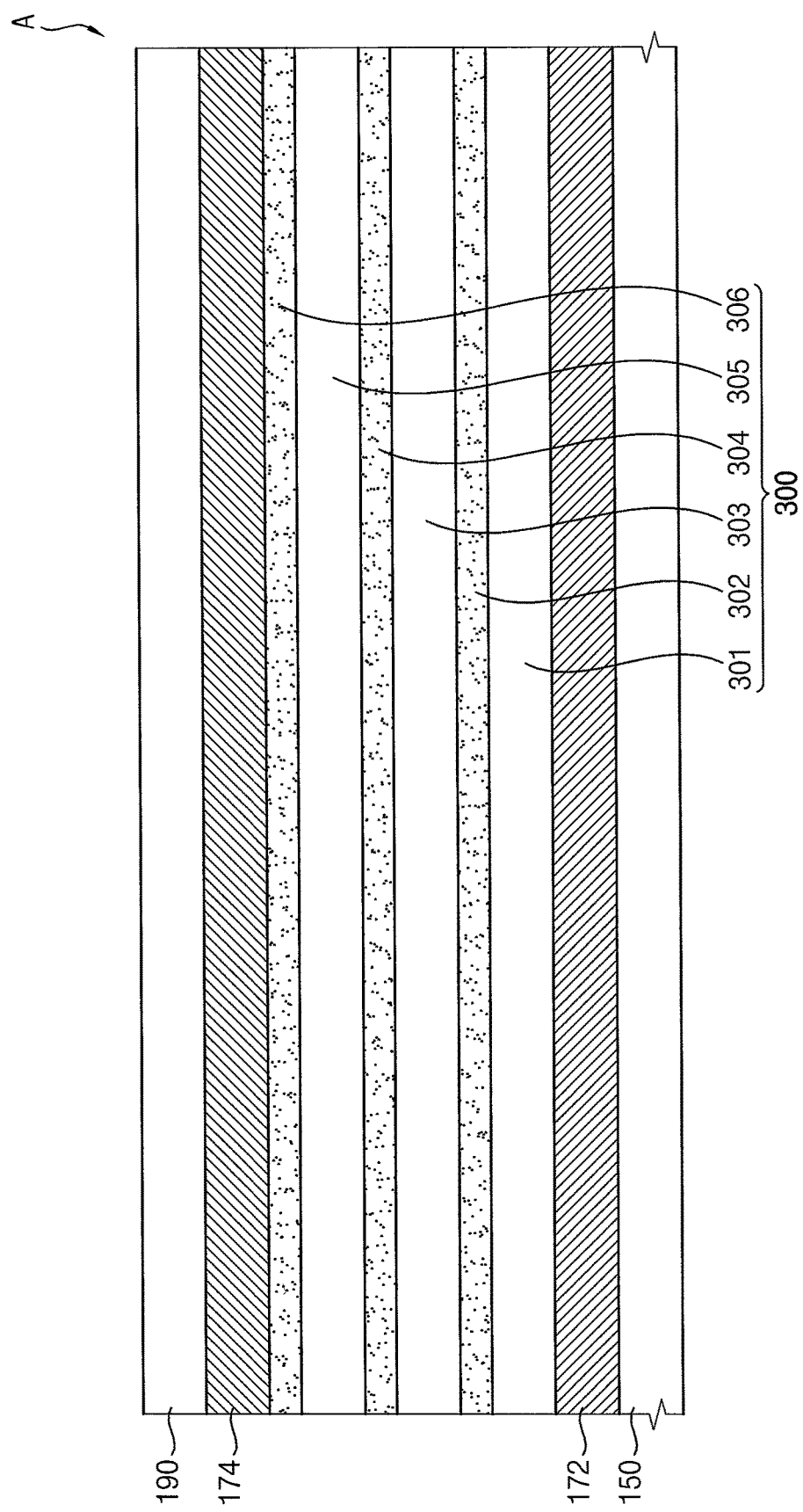
FIG. 2 is an enlarged cross-sectional view corresponding to region 'A' of FIG. 1.

FIG. 1 is a cross sectional view illustrating an exemplary embodiment of an organic light emitting display ("OLED") device in accordance with the invention, and FIG. 2 is an enlarged cross-sectional view corresponding to region 'A' of FIG. 1. FIG. 3 is an enlarged cross-sectional view corresponding to region 'B' of FIG. 1.

Referring to FIGS. 1, 2, and 3, an OLED device 100 may include a substrate 110, a semiconductor element 250, a first capacitor 260, a second capacitor 280, a gate insulation layer 150, a first high dielectric constant (hereinafter "high-k") insulation structure 300, an insulating interlayer 190, a second high-k insulation structure 400, a planarization layer 270, a pixel defining layer 310, a light emitting structure 200, etc. Here, the semiconductor element 250 may include an active layer 130, a gate electrode 170, a source electrode 210, and a drain electrode 230, and the light emitting structure 200 may include a lower electrode 290, a light emitting layer 330, and an upper electrode 340. In addition, the first capacitor 260 may include a first gate electrode pattern 172 and a second gate electrode pattern 174, and the second capacitor 280 may include a first electrode pattern 232 and a second electrode pattern 234. Further, the first high-k insulation structure 300 may include carbon-doped first high-k insulation layers 301, 303, and 305 and first ammonia layers 302, 304, and 306, and the second high-k insulation structure 400 may include carbon-doped second high-k insulation layers 401, 403, and 405 and second ammonia layers 402, 404, and 406. Since the OLED device 100 includes the first high-k insulation structure 300 and the second high-k insulation structure 400, the OLED device 100 may serve as an OLED device including a dielectric layer of a capacitor having a high dielectric constant or a high permittivity and a relatively large thickness. Here, the term 'high dielectric constant' means that the dielectric constant K is 8 or more.

The substrate 110 may be provided. The substrate 110 may include transparent or opaque insulation materials. In an exemplary embodiment, for example, the substrate 110 may include a quartz substrate, a synthetic quartz substrate, a calcium fluoride substrate, a fluoride-doped quartz substrate, a sodalime glass substrate, a non-alkali glass substrate, etc. Alternatively, the substrate 110 may include a flexible transparent material such as a flexible transparent resin substrate (e.g., a polyimide substrate). In an exemplary embodiment, for example, the polyimide substrate may include a first polyimide layer, a barrier film layer, a second polyimide layer, etc. Since the polyimide substrate is relatively thin and flexible, the polyimide substrate may be disposed on a rigid glass substrate to help support the formation of an upper structure (e.g., the semiconductor element 250, the first capacitor 260, the second capacitor 280, the light emitting structure 200, etc.) during a manufacturing process. That is, the substrate 110 may have a structure in which the first polyimide layer, the barrier film layer and the second polyimide layer are stacked on the rigid glass substrate. In a manufacturing the OLED device 100, after an insulation layer (e.g., a buffer layer) is provided on the second polyimide layer of the polyimide substrate, the upper structure may be disposed on the buffer layer. After the upper structure is provided on the buffer layer, the rigid glass substrate on which the polyimide substrate is disposed may be removed. It may be difficult to directly provide the upper structure on the polyimide substrate without the rigid glass substrate because the polyimide substrate is relatively thin and flexible. Accordingly, the upper structure is provided on the polyimide substrate and the rigid glass substrate, and then the polyimide substrate may serve as the substrate 110 of the OLED device 100 after the removal of the rigid glass substrate.

A buffer layer (not shown) may be disposed on the substrate 110. The buffer layer may be disposed on the entire substrate 110. The buffer layer may prevent the diffusion of metal atoms and/or impurities from the substrate 110 into the semiconductor element 250, the first capacitor 260, the second capacitor 280, and the light emitting structure 200. In addition, the buffer layer may control a rate of a heat transfer in a crystallization process for forming the active layer 130, thereby obtaining substantially uniform active layer 130. Further, the buffer layer may improve a surface flatness of the substrate 110 when a surface of the substrate 110 is relatively irregular. In some exemplary embodiments, depending on a type of the substrate 110, at least two buffer layers may be provided on the substrate 110, or the buffer layer may not be disposed. In an exemplary embodiment, for example, the buffer layer may include silicon compound, metal oxide, etc.

The active layer 130 may be disposed on the substrate 110. In an exemplary embodiment, for example, the active layer 130 may include an oxide semiconductor, an inorganic semiconductor (e.g., amorphous silicon, polysilicon, etc.), an organic semiconductor, etc.

The gate insulation layer 150 may be disposed on the active layer 130 and the substrate 110. The gate insulation layer 150 may cover the active layer 130 on the substrate 110 and may be disposed on the entire substrate 110. In an exemplary embodiment, for example, the gate insulation layer 150 may cover the active layer 130 on the substrate 110 and may be disposed with a substantially uniform thickness along a profile of the active layer 130. Alternatively, the gate insulation layer 150 may sufficiently cover the active layer 130 on the substrate 110 and may have a substantially flat upper surface without a step around the active layer 130. The gate insulation layer 150 may include silicon compound, metal oxide, etc. In an exemplary embodiment, for example, the gate insulation layer 150 may include silicon oxide (SiOx), silicon nitride (SiNx), silicon oxynitride (SiOxNy), silicon oxycarbide (SiOxCy), silicon carbon nitride (SiCxNy), aluminum oxide (AlOx), aluminum nitride (AlNx), tantalum oxide (TaOx), hafnium oxide (HfOx), zirconium oxide (ZrOx), titanium oxide (TiOx), etc.

The gate electrode 170 may be disposed on the gate insulation layer 150. The gate electrode 170 may be disposed on a portion of the gate insulation layer 150 under which the active layer 130 is located. In an exemplary embodiment, the gate electrode 170 may include a metal, a metal alloy, metal nitride, conductive metal oxide, transparent conductive materials, etc. These materials may be used alone or in a suitable combination thereof. Alternatively, the gate electrode 170 may have a multi-layered structure.

The first gate electrode pattern 172 may be disposed on the gate insulation layer 150 and may be spaced apart from the gate electrode 170. In some exemplary embodiments, the first gate electrode pattern 172 may be disposed at the same level with the gate electrode 170, and the first gate electrode pattern 172 and the gate electrode 170 may be simultaneously or concurrently formed using the same materials during manufacturing process. The first gate electrode pattern 172 may include a metal, a metal alloy, metal nitride, conductive metal oxide, transparent conductive materials, etc. In an exemplary embodiment, for example, the first gate electrode pattern 172 may include gold (Au), silver (Ag), aluminum (Al), platinum (Pt), nickel (Ni), titanium (Ti), palladium (Pd), magnesium (Mg), Calcium (Ca), Lithium (Li), chrome (Cr), tantalum (Ta), tungsten (W), copper (Cu), molybdenum (Mo), scandium (Sc), neodymium (Nd), Iridium (Ir), an alloy of aluminum, aluminum nitride (AlNx), an alloy of silver, tungsten nitride (WNxi), an alloy of copper, an alloy of molybdenum, titanium nitride (TiNx), chrome nitride (CrNx), tantalum nitride (TaNx), strontium ruthenium oxide (SRO), zinc oxide (ZnOx), indium tin oxide ("ITO"), stannum oxide (SnOx), indium oxide (InOx), gallium oxide (GaOx), indium zinc oxide ("IZO"), etc. These materials may be used alone or in a suitable combination thereof. Alternatively, the first gate electrode pattern 172 may have a multi-layered structure.

The first high-k insulation structure 300 may be disposed on the gate insulation layer 150, the gate electrode 170, and the first gate electrode pattern 172. The first high-k insulation structure 300 may cover the gate electrode 170 and the first gate electrode pattern 172 on the gate insulation layer 150 and may be disposed on the entire gate insulation layer 150. In an exemplary embodiment, for example, the first high-k insulation structure 300 may cover the gate electrode 170 and the first gate electrode pattern 172 on the gate insulation layer 150 and may be disposed with a substantially uniform thickness along a profile of the gate electrode 170 and the first gate electrode pattern 172. Alternatively, the first high-k insulation structure 300 may sufficiently cover the gate electrode 170 and the first gate electrode pattern 172 on the gate insulation layer 150 and may have a substantially flat upper surface without a step around the gate electrode 170 and the first gate electrode pattern 172.

In some exemplary embodiments, the first high-k insulation structure 300 may have a multi-layered structure including the carbon-doped first high-k insulation layers 301, 303, and 305 and the first ammonia layers 302, 304, and 306. As illustrated in FIG. 2, the carbon-doped first high-k insulation layer 301 may be disposed on the first gate electrode pattern 172, and the first ammonia layer 302 may be disposed on the carbon-doped first high-k insulation layer 301. That is, the carbon-doped first high-k insulation layers 301, 303, and 305 and the first ammonia layers 302, 304, and 306 may be alternately and repeatedly disposed one by one as shown in FIG. 2. In some exemplary embodiments, a thickness of the first high-k insulation structure 300 may be equal to or greater than about 100 nanometers, and a thickness of each of the first ammonia layers 302, 304, and 306 may be less than or equal to about 20 nanometers. In addition, a thickness of each of the carbon-doped first high-k insulation layers 301, 303, and 305 may be greater than the thickness of each of the first ammonia layers 302, 304, and 306. In an exemplary embodiment, for example, after the carbon-doped first high-k insulation layer 301 is disposed, the first ammonia layer 302 may be formed on the carbon-doped first high-k insulation layer 301 by performing a plasma treatment process using ammonia (NH3) on the carbon-doped first high-k insulation layer 301. When a thickness of the first ammonia layer 302 is less than or equal to about 20 nanometers, the increase of a dielectric constant of the carbon-doped first high-k insulation layer 301 may be maximized. Each of the carbon-doped first high-k insulation layers 301, 303, and 305 may include a carbon-doped amorphous metal oxide. In an exemplary embodiment, for example, each of the carbon-doped first high-k insulation layers 301, 303, and 305 may include a carbon-doped aluminium oxide or alumina (AlxOy), a carbon-doped zirconium oxide (ZrOx), a carbon-doped hafnium oxide (HfOx), etc. In some exemplary embodiments, each of the carbon-doped first high-k insulation layers 301, 303, and 305 may consist essentially of a carbon-doped amorphous zirconium oxide.

In an exemplary embodiment, for example, a conventional dielectric layer used instead of the first high-k insulation structure 300 of FIG. 1 may be manufactured to have several nanometers in its thickness. In this case, because of the dielectric layer having a relatively small thickness, a breakdown voltage characteristic of the capacitor may be degraded, and a short circuit may be readily occurred by particles. In order to prevent this, when the conventional dielectric layer is manufactured with a relatively large thickness, a metal oxide, which is an ingredient (or component material) of the dielectric layer, may be crystallized. In this case, a leakage current of the capacitor may increase, and it is difficult to perform a dry etch process to remove the dielectric layer since the metal oxide has a relatively large bond energy.

In some exemplary embodiments, in a process (e.g., atomic layer deposition ("ALD") process) for forming the first high-k insulation structure 300, a zirconium oxide may be formed on the gate insulation layer 150, the gate electrode 170, and the first gate electrode pattern 172 by supplying an excess amount of zirconium as a precursor. In this case, the zirconium oxide having a relatively large amount of carbon may be formed, and a crystallization of a carbon-doped zirconium oxide may be suppressed. In other words, the carbon-doped amorphous zirconium oxide may be obtained. After the carbon-doped zirconium oxide is formed, a plasma treatment process may be performed on the carbon-doped zirconium oxide using NH3. When carbon is doped in zirconium oxide, a breakdown voltage characteristic of the first capacitor 260 may relatively improve, and a leakage current of the first capacitor 260 may reduce, but a dielectric constant of the zirconium oxide may decrease due to the carbon. However, when a plasma treatment process is performed on the carbon-doped zirconium oxide using NH3, the dielectric constant of the zirconium oxide may relatively increase. Thus, a dielectric layer having a high dielectric constant may be obtained. By repeatedly performing the process, the first high-k insulation structure 300 having a high dielectric constant and a relatively large thickness may be formed.

The second gate electrode pattern 174 may be disposed on the first high-k insulation structure 300. The second gate electrode pattern 174 may be disposed on a portion of the first high-k insulation structure 300 under which the first gate electrode pattern 172 is located. In other words, the second gate electrode pattern 174 may overlap the first gate electrode pattern 172 in a plan view and may constitute the first capacitor 260 together with the first gate electrode pattern 172 and the first high-k insulation structure 300 therebetween. In an exemplary embodiment, the second gate electrode pattern 174 may include a metal, a metal alloy, metal nitride, conductive metal oxide, transparent conductive materials, etc. These materials may be used alone or in a suitable combination thereof. Alternatively, the second gate electrode pattern 174 may have a multi-layered structure.

The insulating interlayer 190 may be disposed on the first high-k insulation structure 300 and the second gate electrode pattern 174. The insulating interlayer 190 may cover the second gate electrode pattern 174 on the first high-k insulation structure 300 and may be disposed on the entire first high-k insulation structure 300. In an exemplary embodiment, for example, the insulating interlayer 190 may cover the second gate electrode pattern 174 on the first high-k insulation structure 300 and may be disposed with a substantially uniform thickness along a profile of the second gate electrode pattern 174. Alternatively, the insulating interlayer 190 may sufficiently cover the second gate electrode pattern 174 on the first high-k insulation structure 300 and may have a substantially flat upper surface without a step around the second gate electrode pattern 174. In an exemplary embodiment, the insulating interlayer 190 may include silicon compound, metal oxide, etc.

The source electrode 210 and the drain electrode 230 may be disposed on the insulating interlayer 190. The source electrode 210 may be in direct contact with a source region of the active layer 130 via a contact hole defined by removing a portion of the gate insulation layer 150, the first high-k insulation structure 300 and the insulating interlayer 190. The drain electrode 230 may be in direct contact with a drain region of the active layer 130 via a contact hole defined by removing another portion of the gate insulation layer 150, the first high-k insulation structure 300, and the insulating interlayer 190. In an exemplary embodiment, each of the source electrode 210 and the drain electrode 230 may include a metal, an alloy, metal nitride, conductive metal oxide, transparent conductive materials, etc. These materials may be used alone or in a suitable combination thereof. In some exemplary embodiments, each of the source and drain electrodes 210 and 230 may have a multi-layered structure. Accordingly, the semiconductor element 250 including the active layer 130, the gate electrode 170, the source electrode 210, and the drain electrode 230 may be disposed. Alternatively, the source electrode 210 and the drain electrode 230 may be disposed on the second high-k insulation structure 400. In this case, the source electrode 210, the drain electrode 230, and the second electrode pattern 234 may be simultaneously formed using the same materials.

In some exemplary embodiments, the semiconductor element 250 has a top gate structure, but the structure of the semiconductor element 250 according to the invention is not being limited thereto. For example, in some exemplary embodiments, the semiconductor element 250 may have a bottom gate structure or a double gate structure.

The first electrode pattern 232 may be disposed on the insulating interlayer 190 and may be spaced apart from the source electrode 210 and the drain electrode 230. In some exemplary embodiments, the first electrode pattern 232 may be disposed at the same level with the source electrode 210 and the drain electrode 230, and the first electrode pattern 232, the source electrode 210, and the drain electrode 230 may be simultaneously formed using the same materials. In an exemplary embodiment, the first electrode pattern 232 may include a metal, a metal alloy, metal nitride, conductive metal oxide, transparent conductive materials, etc. These materials may be used alone or in a suitable combination thereof. Alternatively, the first electrode pattern 232 may have a multi-layered structure.

The second high-k insulation structure 400 may be provided on the source electrode 210, the drain electrode 230, and the first electrode pattern 232. The second high-k insulation structure 400 may cover the first electrode pattern 232 and the source and drain electrodes 210 and 230 on the insulating interlayer 190 and may be disposed on the entire insulating interlayer 190. In an exemplary embodiment, for example, the second high-k insulation structure 400 may cover the first electrode pattern 232 and the source and drain electrodes 210 and 230 on the insulating interlayer 190 and may be disposed with a substantially uniform thickness along a profile of the first electrode pattern 232 and the source and drain electrodes 210 and 230. Alternatively, the second high-k insulation structure 400 may sufficiently cover the first electrode pattern 232 and the source and drain electrodes 210 and 230 on the insulating interlayer 190 and may have a substantially flat upper surface without a step around the first electrode pattern 232 and the source and drain electrodes 210 and 230.

In some exemplary embodiments, the second high-k insulation structure 400 may have a multi-layered structure including the carbon-doped second high-k insulation layers 401, 403, and 405 and the second ammonia layers 402, 404, and 406. As illustrated in FIG. 3, the carbon-doped second high-k insulation layer 401 may be disposed on the first electrode pattern 232, and the second ammonia layer 402 may be disposed on the carbon-doped second high-k insulation layer 401. That is, the carbon-doped second high-k insulation layers 401, 403, and 405 and the second ammonia layers 402, 404, and 406 may be alternately and repeatedly disposed one by one as shown in FIG. 3. In some exemplary embodiments, a thickness of the second high-k insulation structure 400 may be equal to or greater than about 100 nanometers, and a thickness of each of the second ammonia layers 402, 404, and 406 may be less than or equal to about 20 nanometers. In addition, a thickness of each of the carbon-doped second high-k insulation layers 401, 403, and 405 may be greater than the thickness of each of the second ammonia layers 402, 404, and 406. In an exemplary embodiment, for example, after the carbon-doped second high-k insulation layer 401 is formed, the second ammonia layer 402 may be formed on the carbon-doped second high-k insulation layer 401 by performing a plasma treatment process using NH3 on the carbon-doped second high-k insulation layer 401. When a thickness of the second ammonia layer 402 is less than or equal to about 20 nanometers, the increase of a dielectric constant of the carbon-doped second high-k insulation layer 401 may be maximized. Each of the carbon-doped second high-k insulation layers 401, 403, and 405 may include a carbon-doped amorphous metal oxide. In an exemplary embodiment, for example, each of the carbon-doped second high-k insulation layers 401, 403, and 405 may include a carbon-doped AlxOy, a carbon-doped ZrOx, a carbon-doped HfOx, etc. In some exemplary embodiments, each of the carbon-doped second high-k insulation layers 401, 403, and 405 may consist essentially of a carbon-doped amorphous zirconium oxide.

In some exemplary embodiments, in a process (e.g., ALD process) for forming the second high-k insulation structure 400, a zirconium oxide may be formed on the first high-k insulation structure 300, the source electrode 210, the drain electrode 230, and the first electrode pattern 232 by supplying an excess amount of zirconium as a precursor. In this case, the zirconium oxide having a relatively large amount of carbon may be formed, and a crystallization of a carbon-doped zirconium oxide may be suppressed. In other words, the carbon-doped amorphous zirconium oxide may be obtained. After the carbon-doped zirconium oxide is formed, a plasma treatment process may be performed on the carbon-doped zirconium oxide using NH3. When carbon is doped in zirconium oxide, a breakdown voltage characteristic of the second capacitor 280 may relatively improve, and a leakage current of the second capacitor 280 may reduce, but a dielectric constant of the zirconium oxide may decrease due to the carbon. However, when a plasma treatment process is performed on the carbon-doped zirconium oxide using NH3, the dielectric constant of the zirconium oxide may relatively increase. Thus, a dielectric layer having a high dielectric constant may be obtained. By repeatedly performing the process, the second high-k insulation structure 400 having a high dielectric constant and a relatively large thickness may be formed. In other words, the first high-k insulation structure 300 and the second high-k insulation structure 400 may have the same structure or the same configuration.

The second electrode pattern 234 may be disposed on the second high-k insulation structure 400. The second electrode pattern 234 may be disposed on a portion of the second high-k insulation structure 400 under which the first electrode pattern 232 is located. In other words, the second electrode pattern 234 may overlap the first electrode pattern 232 in a plan view and may constitute the second capacitor 280 together with the first electrode pattern 232 and the second high-k insulation structure 400 therebetween. In an exemplary embodiment, the second electrode pattern 234 may include a metal, an alloy of a metal, metal nitride, conductive metal oxide, transparent conductive materials, etc. These materials may be used alone or in a suitable combination thereof. Alternatively, the second electrode pattern 234 may have a multi-layered structure.

The planarization layer 270 may be disposed on the second high-k insulation structure 400 and the second electrode pattern 234. The planarization layer 270 may cover the second electrode pattern 234 on the second high-k insulation structure 400 and may be disposed on the entire second high-k insulation structure 400. In an exemplary embodiment, for example, the planarization layer 270 may be disposed with a high thickness to sufficiently cover the second electrode pattern 234 on the second high-k insulation structure 400. In this case, the planarization layer 270 may have a substantially flat upper surface, and a planarization process may be further performed on the planarization layer 270 to implement the flat upper surface of the planarization layer 270. The planarization layer 270 may include organic materials or inorganic materials. In some exemplary embodiments, the planarization layer 270 may include organic materials such as an epoxy-based resin, an acryl-based resin, photoresist, a polyacryl-based resin, a polyimide-based resin, a polyamide-based resin, a siloxane-based resin, etc.

The lower electrode 290 may be disposed on the planarization layer 270. In some exemplary embodiments, the lower electrode 290 may be disposed on a portion of the planarization layer 270 under which the semiconductor element 250 is located and may be in contact with the drain electrode 230 via contact hole defined by removing a portion of the planarization layer 270 (not shown). In addition, the lower electrode 290 may be electrically connected to the semiconductor element 250. In an exemplary embodiment, the lower electrode 290 may include a metal, a metal alloy, metal nitride, conductive metal oxide, transparent conductive materials, etc. These materials may be used alone or in a suitable combination thereof. In some exemplary embodiments, the lower electrode 290 may have a multi-layered structure.

The pixel defining layer 310 may be disposed on a portion of the lower electrode 290 and the planarization layer 270. That is, the pixel defining layer 310 may cover both lateral portions of the lower electrode 290, and a portion of the lower electrode 290 is exposed from the pixel defining layer 310. The pixel defining layer 310 may include organic materials or inorganic materials. In exemplary embodiments, the pixel defining layer 310 may include organic materials.

The light emitting layer 330 may be disposed on a portion of the lower electrode 290 not covered by the pixel defining layer 310. The light emitting layer 330 may be formed using at least one of light emitting materials capable of generating different colors of light (e.g., a red color of light, a blue color of light, and a green color of light, etc.) according to sub-pixels. In another exemplary embodiment, the light emitting layer 330 may generally generate a white color of light by stacking a plurality of light emitting materials capable of generating different colors of light such as a red color of light, a green color of light, a blue color of light, etc. In this case, a color filter may be disposed on the light emitting layer 330. For example, the color filter may overlap the light emitting layer 330 on a lower surface of an encapsulation substrate. The color filter may include at least one-color filter selected from a red color filter, a green color filter, and a blue color filter. Alternatively, the color filter may include a yellow color filter, a cyan color filter, and a magenta color filter. The color filter may include a photosensitive resin, etc.

The upper electrode 340 may be disposed on the pixel defining layer 310 and the light emitting layer 330. The upper electrode 340 may cover the light emitting layer 330 and the pixel defining layer 310 and may be disposed on the entire light emitting layer 330 and the entire pixel defining layer 310. In an exemplary embodiment, the upper electrode 340 may include a metal, a metal alloy, metal nitride, conductive metal oxide, transparent conductive materials, etc. These materials may be used alone or in a suitable combination thereof. Alternatively, the upper electrode 340 may have a multi-layered structure. Accordingly, the light emitting structure 200 including the lower electrode 290, the light emitting layer 330, and the upper electrode 340 may be provided.

An encapsulation substrate (not shown) may be disposed on the upper electrode 340. The encapsulation substrate and the substrate 110 may include substantially the same materials. In an exemplary embodiment, for example, the encapsulation substrate may include a quartz substrate, a synthetic quartz substrate, a calcium fluoride substrate, a fluoride-doped quartz substrate, a sodalime glass substrate, a non-alkali glass substrate, etc. In some exemplary embodiments, the encapsulation substrate may include a transparent inorganic material or flexible plastic. For example, the encapsulation substrate may include a flexible transparent resin substrate. In this case, to increase flexibility of the OLED device 100, the encapsulation substrate may include a stacked structure where at least one inorganic layer and at least one organic layer are alternately stacked.

Since the OLED device 100 in accordance with the invention includes the first and second high-k insulation structures 300 and 400 having a high dielectric constant and a relatively large thickness, a breakdown voltage characteristic of the first and second capacitors 260 and 280 may relatively improve, and a leakage current of the first and second capacitors 260 and 280 may reduce. In addition, since the first and second high-k insulation structures 300 and 400 have a relatively large thickness, the first and second capacitors 260 and 280 may not be shorted or cut. Further, a dry etch process to remove the first and second high-k insulation structures 300 and 400 may be readily performed since an ingredient included in the first and second high-k insulation structures 300 and 400 has a relatively small bond energy.

A breakdown voltage, a leakage current, and a dielectric constant are calculated in the case that a plasma treatment process is performed using NH3. The calculated values are shown in Table 1 below.

Experimental Example: Measurement of Crystallinity of Zirconium Oxide According to Carbon Doping After zirconium oxide of Comparative Example is formed, crystallization of zirconium oxide was measured (refer to FIG. 4A).

Figure 4A:
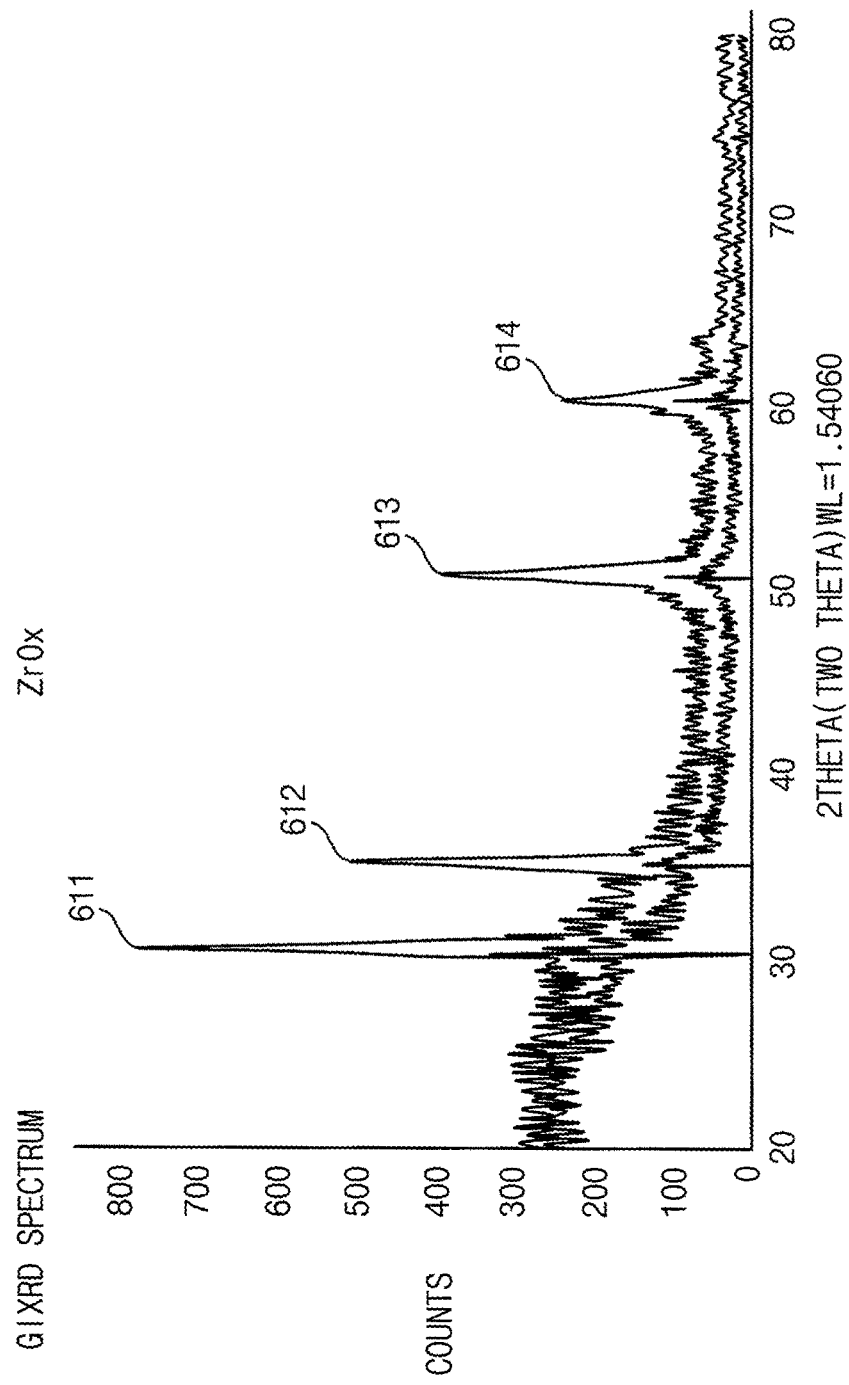
FIG. 4A is a graph illustrating degree of crystallinity of zirconium oxide of a comparative example.
Figure 4B:
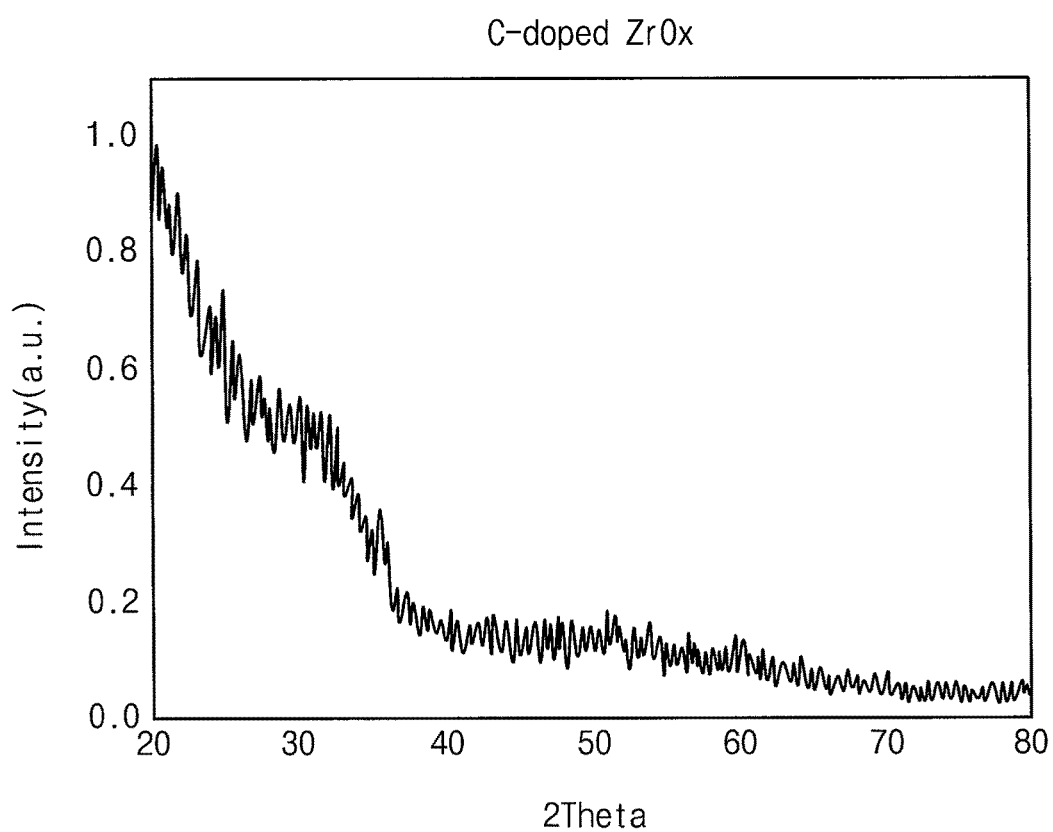
FIG. 4B is a graph illustrating degree of crystallinity of c-doped zirconium oxide of FIG. 1.

In addition, after zirconium oxide of Example is formed, crystallization of carbon-doped zirconium oxide was measured (refer to FIG. 4B).

As illustrated in FIG. 4A, from the result that peaks 611, 612, 613, and 614 exist in the zirconium oxide of Comparative Example, it is determined that crystallization occurs in the zirconium oxide of Comparative Example.

On the other hand, as illustrated in FIG. 4B, from the result that peak does not exist in the carbon-doped zirconium oxide of Example, it is determined that crystallization does not occur in the carbon-doped zirconium oxide of Example. In this way, the carbon-doped zirconium oxide may be obtained.

Figure 4C:
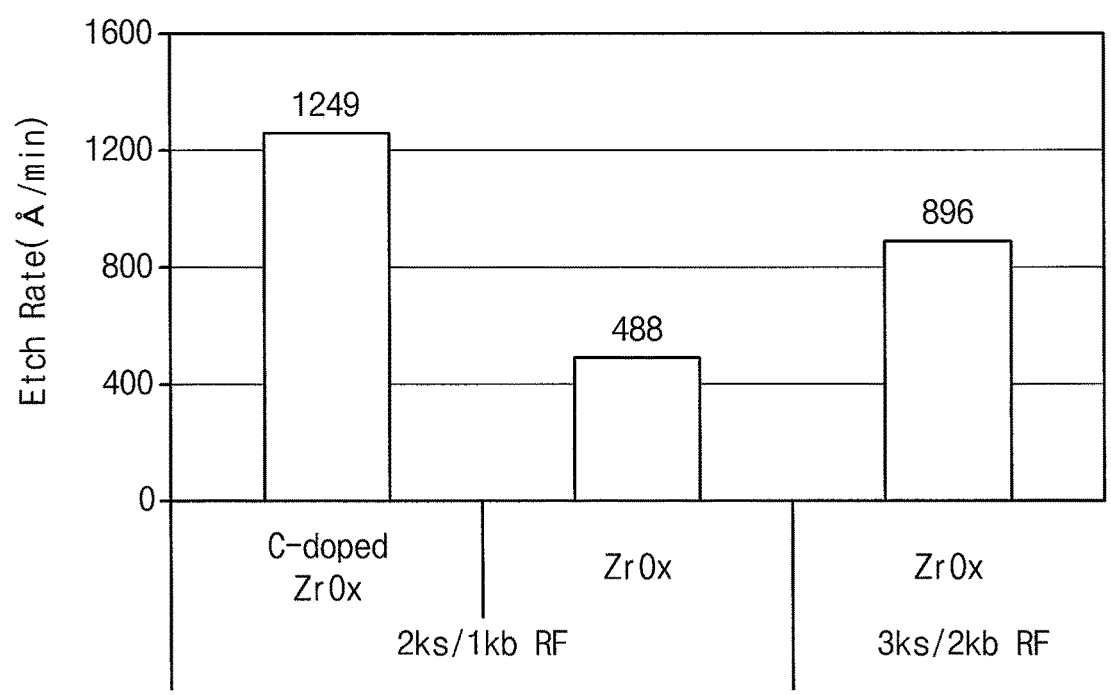
FIG. 4C is a graph illustrating etch rates of c-doped zirconium oxide of FIG. 1 and comparative examples.

FIG. 4C is a graph illustrating etch rates of c-doped zirconium oxide of FIG. 1 and comparative examples.

Experimental Example: Measurement of Etch Rate of Zirconium Oxide According to Carbon Doping After zirconium oxide of Comparative Example is formed, etch rate was measured by performing dry etch process using chlorine (Cl) and argon (Ar).

TABLE 1

|  | Zr | O | C | (dielectric constant) Kox | (breakdown voltage) MV/c | (leakage current) A/s |
|---|---|---|---|---|---|---|
| ZrOx | 35.15 | 63.03 | 1.13 | 36 | 2.0 | $9.27 \times 10^{-11}$ |
| C-doped ZrOx | 28.21 | 51.85 | 18.43 | 16 | 6.0 | $9.16 \times 10^{-12}$ |
| NH3 PT/ C-doped ZrOx | (surface) 32.87 (inside) 28.22 | (surface) 61.64 (inside) 46.76 | (surface) 4.98 (inside) 23.48 | 29 | 3.0 | $4.54 \times 10^{-11}$ |

As shown in Table 1, when carbon is doped in zirconium oxide, a breakdown voltage characteristic relatively improves, and a leakage current reduces, but a dielectric constant of the zirconium oxide decreases.

In addition, when a plasma treatment process is performed on the carbon-doped zirconium oxide using NH3, the dielectric constant may relatively increase. In an exemplary embodiment, for example, when a thickness of the ammonia layer is less than or equal to about 20 nanometers, the increase of a dielectric constant of the carbon-doped zirconium oxide may be maximized.

FIG. 4A is a graph illustrating degree of crystallinity of zirconium oxide of a comparative example, and FIG. 4B is a graph illustrating degree of crystallinity of c-doped zirconium oxide of FIG. 1.

The following Examples and Comparative Examples are provided in order to highlight characteristics of one or more exemplary embodiments according to the invention, but it will be understood that the Examples and Comparative Examples are not to be construed as limiting the scope of the exemplary embodiments, nor are the Comparative Examples to be construed as being outside the scope of the exemplary embodiments. Further, it will be understood that the exemplary embodiments according to the invention are not limited to the particular details described in the Examples and Comparative Examples.

In addition, after carbon-doped zirconium oxide of Example is formed, etch rate was measured by performing dry etch process using chlorine (Cl) and argon (Ar).

As illustrated in FIG. 4C, etch rate of the carbon-doped zirconium oxide of Example is higher than etch rates of the zirconium oxides of Comparative Example. This shows that the dry etch process of the carbon-doped zirconium oxide may be relatively readily performed rather than the dry etch process of the zirconium oxide.

FIGS. 5 through 18 are cross-sectional views illustrating an exemplary embodiment of a method of manufacturing an OLED device in accordance with the invention.

Figure 5:
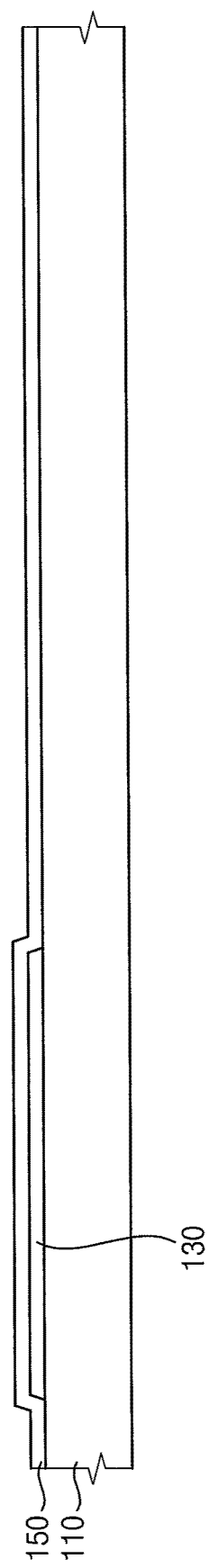
FIGS. 5 through 18 are cross-sectional views illustrating an exemplary embodiment of a method of manufacturing an OLED device in accordance with the invention.

Referring to FIG. 5, a substrate 110 may be provided. The substrate 110 may include transparent or opaque insulation materials. In an exemplary embodiment, for example, the substrate 110 may be formed using a quartz substrate, a synthetic quartz substrate, a calcium fluoride substrate, a fluoride-doped quartz substrate, a sodalime glass substrate, a non-alkali glass substrate etc.

A buffer layer (not shown) may be formed on the substrate 110. The buffer layer may be formed on the entire substrate 110. The buffer layer may prevent the diffusion of metal atoms and/or impurities from the substrate 110 into a semiconductor element, capacitors, and a light emitting structure. In addition, the buffer layer may control a rate of a heat transfer in a crystallization process for forming an active layer, thereby obtaining substantially uniform active layer.

Further, the buffer layer may improve a surface flatness of the substrate 110 when a surface of the substrate 110 is relatively irregular. According to a type of the substrate 110, at least two buffer layers may be provided on the substrate 110, or the buffer layer may not be formed. In an exemplary embodiment, for example, the buffer layer may be formed using silicon compound, metal oxide, etc.

An active layer 130 may be formed on the substrate 110. In an exemplary embodiment, for example, the active layer 130 may be formed using an oxide semiconductor, an inorganic semiconductor (e.g., amorphous silicon, polysilicon, etc.), an organic semiconductor, etc.

A gate insulation layer 150 may be formed on the active layer 130 and the substrate 110. The gate insulation layer 150 may cover the active layer 130 on the substrate 110 and may be formed on the entire substrate 110. In an exemplary embodiment, for example, the gate insulation layer 150 may cover the active layer 130 on the substrate 110 and may be formed with a substantially uniform thickness along a profile of the active layer 130. Alternatively, the gate insulation layer 150 may sufficiently cover the active layer 130 on the substrate 110 and may have a substantially flat upper surface without a step around the active layer 130. The gate insulation layer 150 may be formed using silicon compound, metal oxide, etc. In an exemplary embodiment, for example, the gate insulation layer 150 may include $SiO_x$, $SiN_x$, $SiO_xN_y$, $SiO_xC_y$, $SiC_xN_y$, $AlO_x$, $AlN_x$, $TaO_x$, $HfO_x$, $ZrO_x$, $TiO_x$, etc.

Figure 6:
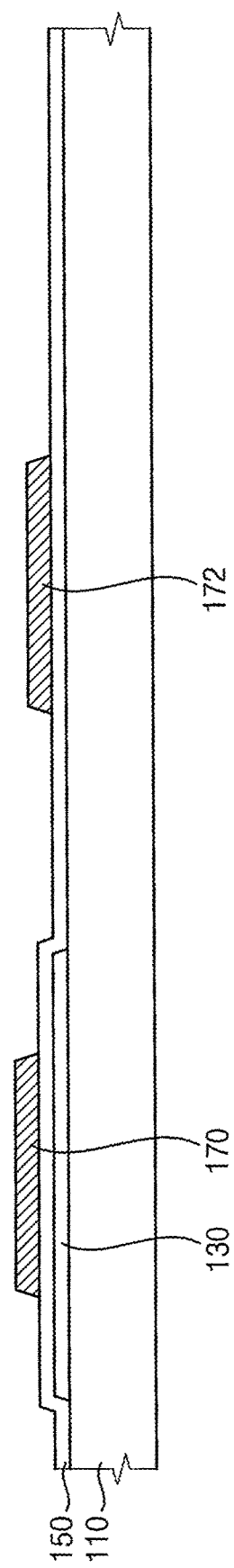

Referring to FIG. 6, a gate electrode 170 may be formed on the gate insulation layer 150. The gate electrode 170 may be formed on a portion of the gate insulation layer 150 under which the active layer 130 is located. In an exemplary embodiment, the gate electrode 170 may be formed using a metal, a metal alloy, metal nitride, conductive metal oxide, transparent conductive materials, etc. These materials may be used alone or in a suitable combination thereof. Alternatively, the gate electrode 170 may have a multi-layered structure.

A first gate electrode pattern 172 may be formed on the gate insulation layer 150 and may be spaced apart from the gate electrode 170. In exemplary embodiments, the first gate electrode pattern 172 may be disposed at the same level with the gate electrode 170, and the first gate electrode pattern 172 and the gate electrode 170 may be simultaneously formed using the same materials. In an exemplary embodiment, for example, after a preliminary gate electrode layer is formed on the entire gate insulation layer 150, the gate electrode 170 and the first gate electrode pattern 172 may be simultaneously formed by selectively etching the preliminary gate electrode layer. The first gate electrode pattern 172 may be formed using a metal, a metal alloy, metal nitride, conductive metal oxide, transparent conductive materials, etc. In an exemplary embodiment, for example, the first gate electrode pattern 172 may include Au, Ag, Al, Pt, Ni, Ti, Pd, Mg, Ca, Li, Cr, Ta, W, Cu, Mo, Sc, Nd, Ir, an alloy of aluminum, $AlN_x$, an alloy of silver, $WN_x$, an alloy of copper, an alloy of molybdenum, $TiN_x$, $CrN_x$, $TaN_x$, SRO, $ZnO_x$, ITO, $SnO_x$, $InO_x$, $GaO_x$, IZO, etc. These materials may be used alone or in a suitable combination thereof. Alternatively, the first gate electrode pattern 172 may have a multi-layered structure.

Figure 7:
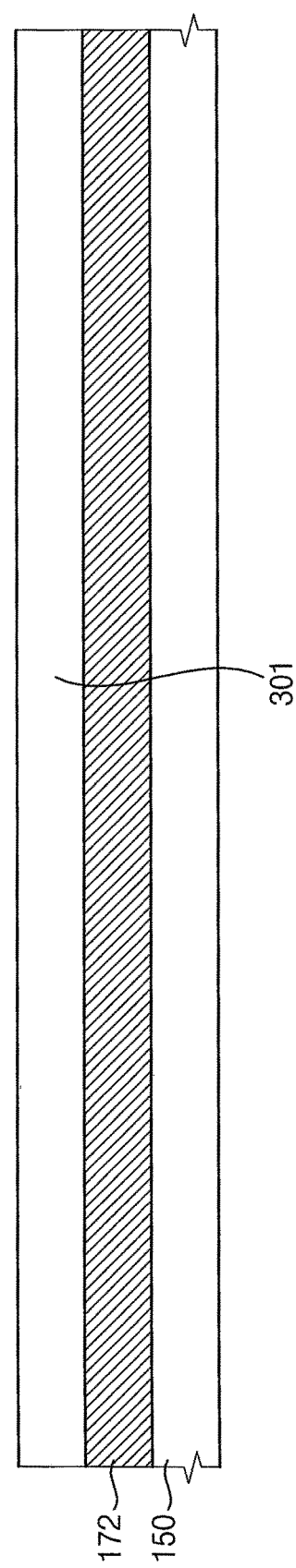

Referring to FIG. 7, a carbon-doped first high-k insulation layer 301 may be formed on the gate insulation layer 150, the gate electrode 170, and the first gate electrode pattern 172. The carbon-doped first high-k insulation layer 301 may cover the gate electrode 170 and the first gate electrode pattern 172 on the gate insulation layer 150 and may be formed on the entire gate insulation layer 150. In an exemplary embodiment, for example, the carbon-doped first high-k insulation layer 301 may cover the gate electrode 170 and the first gate electrode pattern 172 on the gate insulation layer 150 and may be formed with a substantially uniform thickness along a profile of the gate electrode 170 and the first gate electrode pattern 172. In an exemplary embodiment, the carbon-doped first high-k insulation layer 301 may be formed using a carbon-doped $Al_xO_y$, a carbon-doped $ZrO_x$, a carbon-doped $HfO_x$, etc.

In some exemplary embodiments, the carbon-doped first high-k insulation layer 301 may be formed through an ALD process. In an exemplary embodiment, for example, a zirconium oxide may be formed on the gate insulation layer 150, the gate electrode 170, and the first gate electrode pattern 172 by supplying an excess amount of zirconium as a precursor. In this case, the zirconium oxide having a relatively large amount of carbon may be formed, and a crystallization of a carbon-doped zirconium oxide may be suppressed. In other words, the carbon-doped amorphous zirconium oxide may be obtained, and the carbon-doped first high-k insulation layer 301 may consist essentially of a carbon-doped amorphous zirconium oxide.

Figure 8:
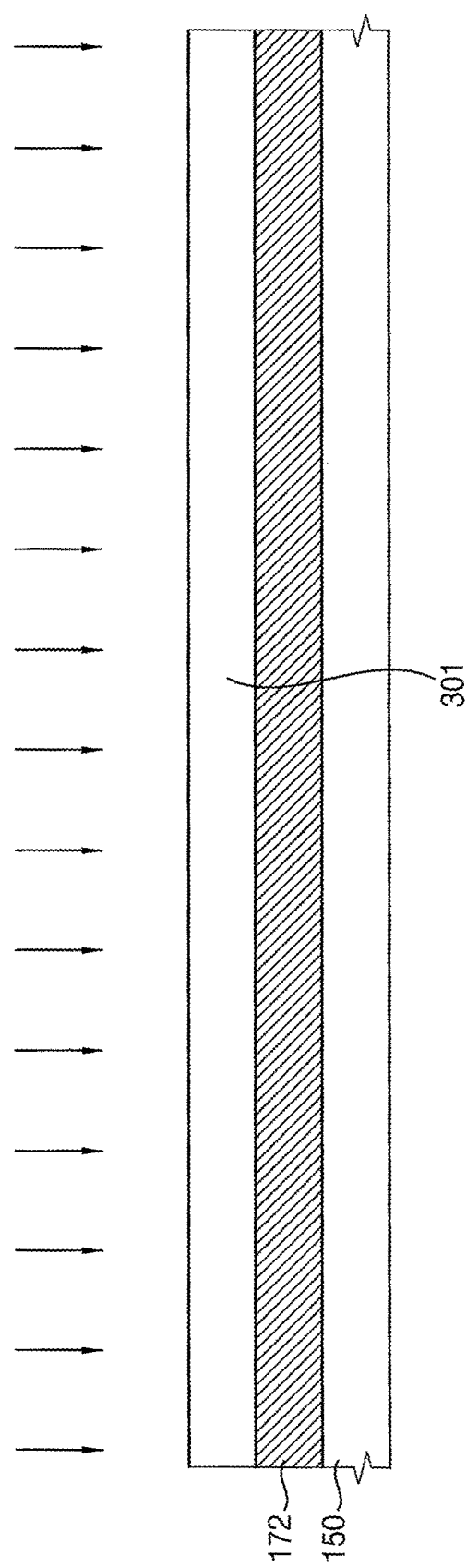
Figure 9:
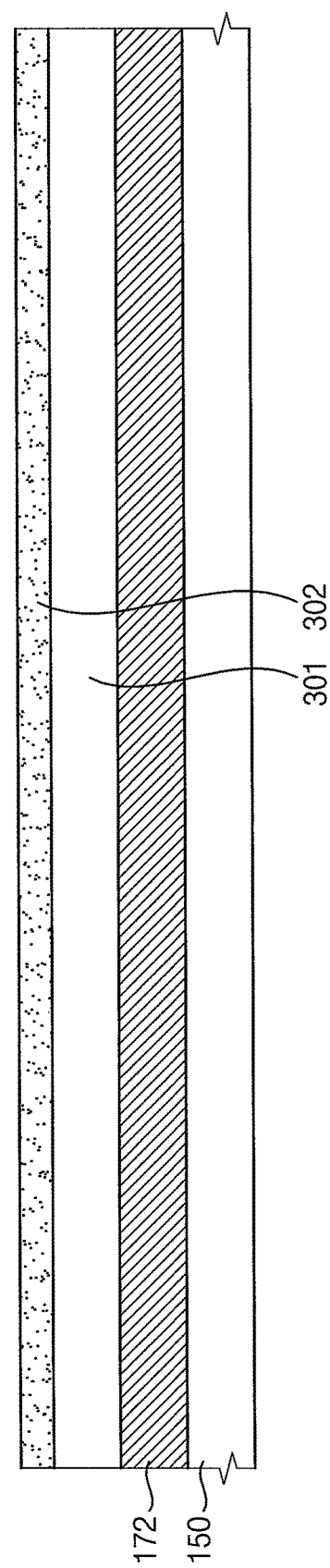

Referring to FIGS. 8 and 9, a plasma treatment process may be performed on the carbon-doped first high-k insulation layer 301 using NH3. After the plasma treatment process may be performed using NH3, a first ammonia layer 302 may be formed on the carbon-doped first high-k insulation layer 301. The first ammonia layer 302 may be less than or equal to about 20 nanometers in its thickness, and a thickness of the carbon-doped first high-k insulation layer 301 may be greater than the thickness of the first ammonia layer 302. When carbon is doped in zirconium oxide, a breakdown voltage characteristic of a first capacitor 260, which will be described below, may relatively improve, and a leakage current of the first capacitor 260 may reduce, but a dielectric constant of the zirconium oxide may decrease due to the carbon. However, when a plasma treatment process is performed on the carbon-doped zirconium oxide using NH3, the dielectric constant of the zirconium oxide may relatively increase. Thus, a dielectric layer having a high dielectric constant may be obtained. In an exemplary embodiment, for example, when a thickness of the first ammonia layer 302 is less than or equal to about 20 nanometers, the increase of a dielectric constant of the carbon-doped first high-k insulation layer 301 may be maximized.

Figure 10:
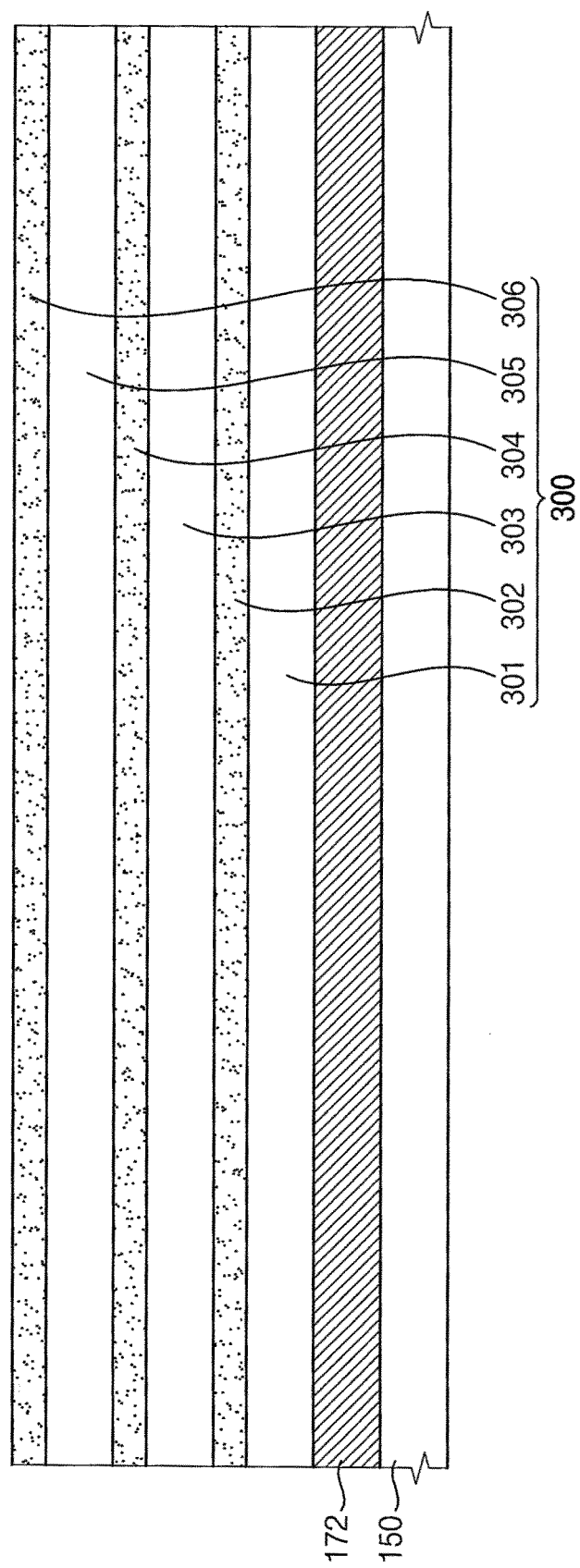

Referring to FIG. 10, a carbon-doped first high-k insulation layer 303, a first ammonia layer 304, a carbon-doped first high-k insulation layer 305, and a first ammonia layer 306 may be formed in this order by repeatedly performing the process illustrated in FIGS. 8 and 9. In other words, the carbon-doped first high-k insulation layer 301 may be substantially the same as the carbon-doped first high-k insulation layers 303 and 305, and the first ammonia layer 302 may be substantially the same as the first ammonia layers 304 and 306 in their materials and thicknesses. Accordingly, a first high-k insulation structure 300 having a high dielectric constant and a relatively large thickness may be formed on the gate insulation layer 150, the gate electrode 170, and the first gate electrode pattern 172.

Figure 11:
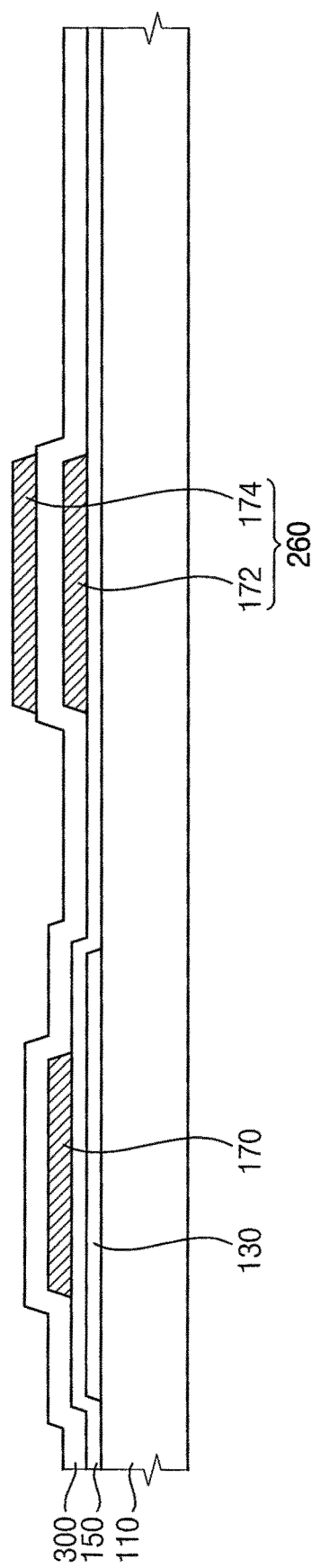

Referring to FIG. 11, a second gate electrode pattern 174 may be formed on the first high-k insulation structure 300. The second gate electrode pattern 174 may be formed on a portion of the first high-k insulation structure 300 under which the first gate electrode pattern 172 is located. In other words, the second gate electrode pattern 174 may overlap the first gate electrode pattern 172 in a plan view and may constitute the first capacitor 260 together with the first gate electrode pattern 172 and the first high-k insulation structure 300 therebetween. In an exemplary embodiment, the second gate electrode pattern 174 may be formed using a metal, a metal alloy, metal nitride, conductive metal oxide, transparent conductive materials, etc. These materials may be used alone or in a suitable combination thereof. Alternatively, the second gate electrode pattern 174 may have a multi-layered structure.

Figure 12:
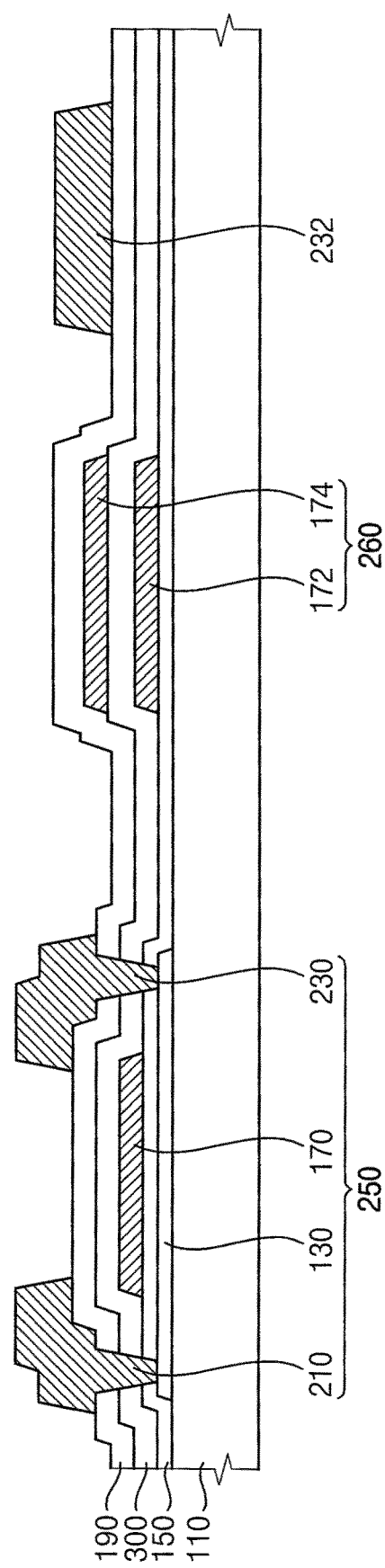

Referring to FIG. 12, an insulating interlayer 190 may be formed on the first high-k insulation structure 300 and the second gate electrode pattern 174. The insulating interlayer 190 may cover the second gate electrode pattern 174 on the first high-k insulation structure 300 and may be formed on the entire first high-k insulation structure 300. In an exemplary embodiment, for example, the insulating interlayer 190 may cover the second gate electrode pattern 174 on the first high-k insulation structure 300 and may be formed with a substantially uniform thickness along a profile of the second gate electrode pattern 174. Alternatively, the insulating interlayer 190 may sufficiently cover the second gate electrode pattern 174 on the first high-k insulation structure 300 and may have a substantially flat upper surface without a step around the second gate electrode pattern 174. The insulating interlayer 190 may be formed using silicon compound, metal oxide, etc.

A source electrode 210 and a drain electrode 230 may be formed on the insulating interlayer 190. The source electrode 210 may be in direct contact with a source region of the active layer 130 via a contact hole defined by removing a portion of the gate insulation layer 150, the first high-k insulation structure 300 and the insulating interlayer 190. The drain electrode 230 may be in direct contact with a drain region of the active layer 130 via a contact hole defined by removing another portion of the gate insulation layer 150, the first high-k insulation structure 300, and the insulating interlayer 190. In an exemplary embodiment, each of the source electrode 210 and the drain electrode 230 may be formed using a metal, an alloy, metal nitride, conductive metal oxide, transparent conductive materials, etc. These materials may be used alone or in a suitable combination thereof. In some exemplary embodiments, each of the source and drain electrodes 210 and 230 may have a multi-layered structure. Accordingly, a semiconductor element 250 including the active layer 130, the gate electrode 170, the source electrode 210, and the drain electrode 230 may be formed.

A first electrode pattern 232 may be formed on the insulating interlayer 190 and may be spaced apart from the source electrode 210 and the drain electrode 230. In some exemplary embodiments, the first electrode pattern 232 may be disposed at the same level with the source electrode 210 and the drain electrode 230, and the first electrode pattern 232, the source electrode 210, and the drain electrode 230 may be simultaneously formed using the same materials. In an exemplary embodiment, for example, after a preliminary electrode layer is formed on the entire insulating interlayer 190, the source electrode 210, the drain electrode 230, and the first electrode pattern 232 may be simultaneously formed by selectively etching the preliminary electrode layer. In an exemplary embodiment, the first electrode pattern 232 may be formed using a metal, a metal alloy, metal nitride, conductive metal oxide, transparent conductive materials, etc. These materials may be used alone or in a suitable combination thereof. Alternatively, the first electrode pattern 232 may have a multi-layered structure.

Figure 13:
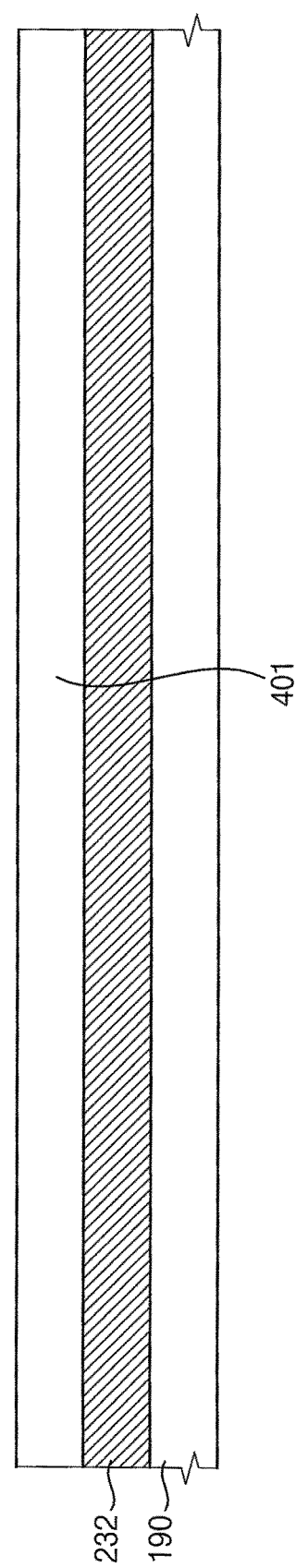

Referring to FIG. 13, a carbon-doped second high-k insulation layer 401 may be formed on the insulating interlayer 190, the source electrode 210, the drain electrode 230, and the first electrode pattern 232. The carbon-doped second high-k insulation layer 401 may cover the source electrode 210, the drain electrode 230, and the first electrode pattern 232 on the insulating interlayer 190 and may be formed on the entire insulating interlayer 190. In an exemplary embodiment, for example, the carbon-doped second high-k insulation layer 401 may cover the source electrode 210, the drain electrode 230, and the first electrode pattern 232 on the insulating interlayer 190 and may be formed with a substantially uniform thickness along a profile of the source electrode 210, the drain electrode 230, and the first electrode pattern 232. In an exemplary embodiment, the carbon-doped second high-k insulation layer 401 may be formed using a carbon-doped $AlxOy$, a carbon-doped $ZrOx$, a carbon-doped $HfOx$, etc.

In some exemplary embodiments, the carbon-doped second high-k insulation layer 401 may be formed through an ALD process. In an exemplary embodiment, for example, a zirconium oxide may be formed on the insulating interlayer 190, the source electrode 210, the drain electrode 230, and the first electrode pattern 232 by supplying an excess amount of zirconium as a precursor. In this case, the zirconium oxide having a relatively large amount of carbon may be formed, and a crystallization of a carbon-doped zirconium oxide may be suppressed. In other words, the carbon-doped amorphous zirconium oxide may be obtained, and the carbon-doped second high-k insulation layer 401 may consist essentially of a carbon-doped amorphous zirconium oxide.

Figure 14:
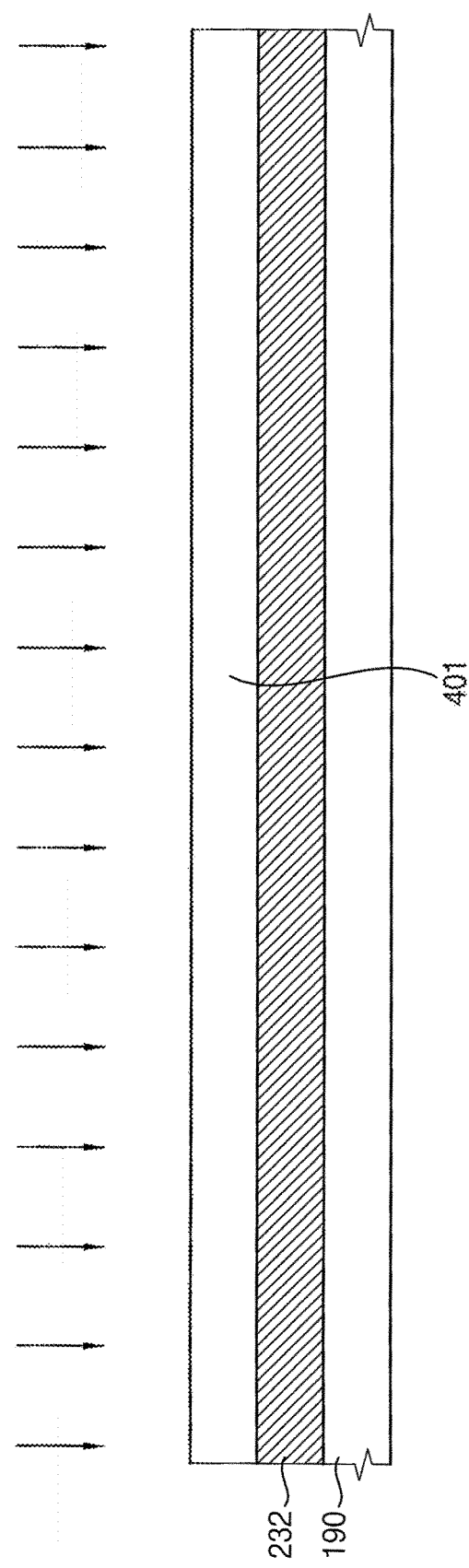
Figure 15:
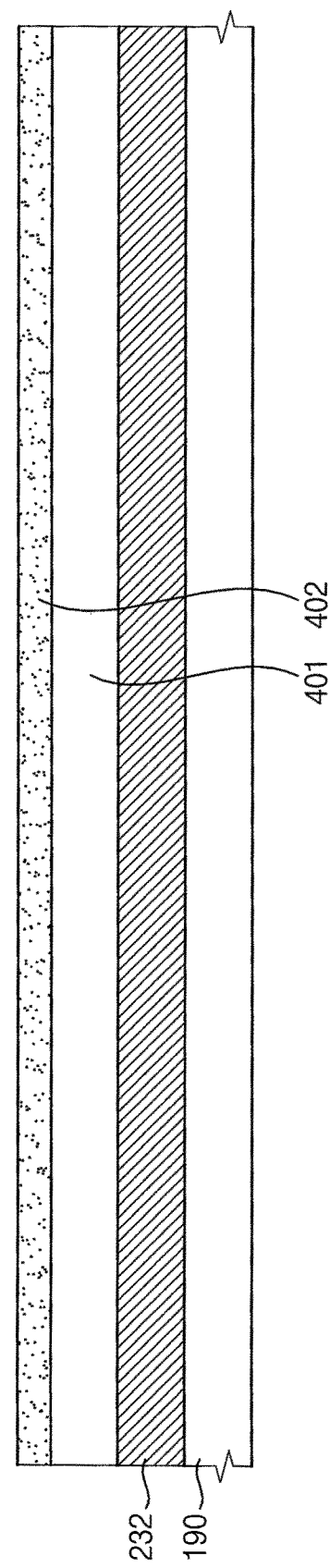

Referring to FIGS. 14 and 15, a plasma treatment process may be performed on the carbon-doped second high-k insulation layer 401 using NH3. After the plasma treatment process may be performed using NH3, a second ammonia layer 402 may be formed on the carbon-doped second high-k insulation layer 401. The second ammonia layer 402 may be less than or equal to about 20 nanometers in its thickness, and a thickness of the carbon-doped second high-k insulation layer 401 may be greater than the thickness of the second ammonia layer 402. When carbon is doped in zirconium oxide, a breakdown voltage characteristic of a second capacitor 280, which will be described below, may relatively improve, and a leakage current of the second capacitor 280 may reduce, but a dielectric constant of the zirconium oxide may decrease due to the carbon. However, when a plasma treatment process is performed on the carbon-doped zirconium oxide using NH3, the dielectric constant of the zirconium oxide may relatively increase. Thus, a dielectric layer having a high dielectric constant may be obtained. In an exemplary embodiment, for example, when a thickness of the second ammonia layer 402 is less than or equal to about 20 nanometers, the increase of a dielectric constant of the carbon-doped second high-k insulation layer 401 may be maximized.

Figure 16:
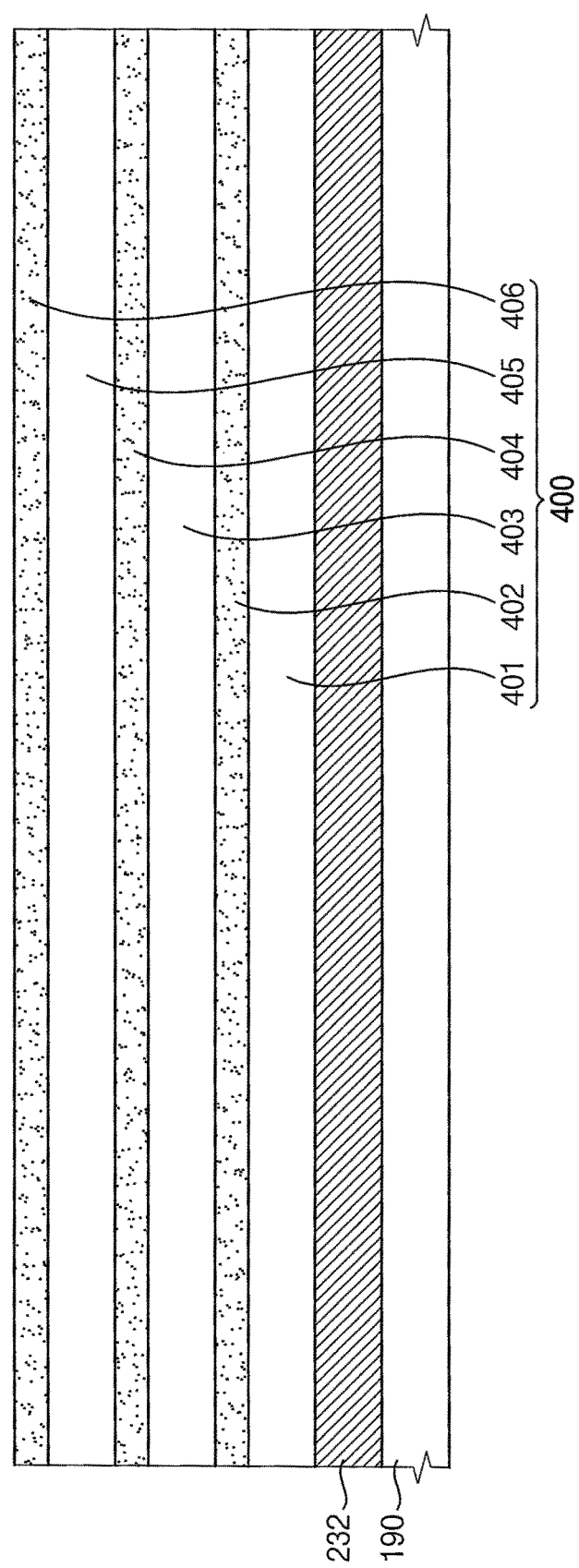

Referring to FIG. 16, a carbon-doped second high-k insulation layer 403, a second ammonia layer 404, a carbon-doped second high-k insulation layer 405, and a second ammonia layer 406 may be formed in this order by repeatedly performing the process illustrated in FIGS. 14 and 15. In other words, the carbon-doped second high-k insulation layer 401 may be substantially the same as the carbon-doped second high-k insulation layers 403 and 405, and the second ammonia layer 402 may be substantially the same as the second ammonia layers 404 and 406 in their materials and thicknesses. Accordingly, a second high-k insulation structure 400 having a high dielectric constant and a relatively large thickness may be formed on the insulating interlayer 190, the source electrode 210, the drain electrode 230, and the first electrode pattern 232.

Figure 17:
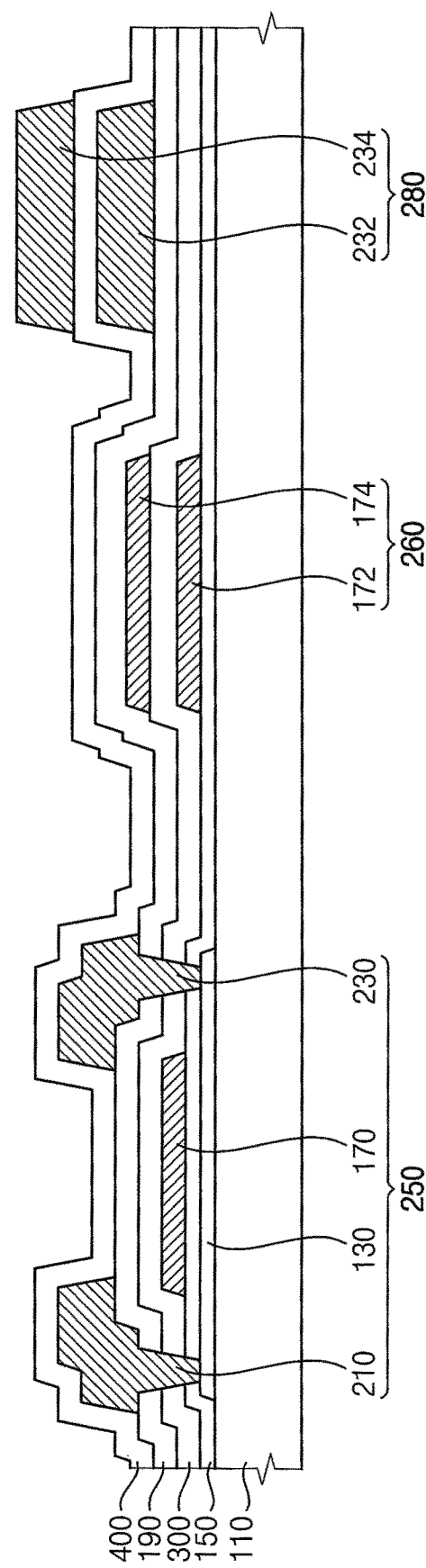

Referring to FIG. 17, a second electrode pattern 234 may be formed on the second high-k insulation structure 400. The second electrode pattern 234 may be formed on a portion of the second high-k insulation structure 400 under which the first electrode pattern 232 is located. In other words, the second electrode pattern 234 may overlap the first electrode pattern 232 in a plan view and may constitute the second capacitor 280 together with the first electrode pattern 232 and the second high-k insulation structure 400 therebetween. In an exemplary embodiment, the second electrode pattern 234 may be formed using a metal, an alloy of a metal, metal nitride, conductive metal oxide, transparent conductive materials, etc. These materials may be used alone or in a suitable combination thereof. Alternatively, the second electrode pattern 234 may have a multi-layered structure.

Figure 18:
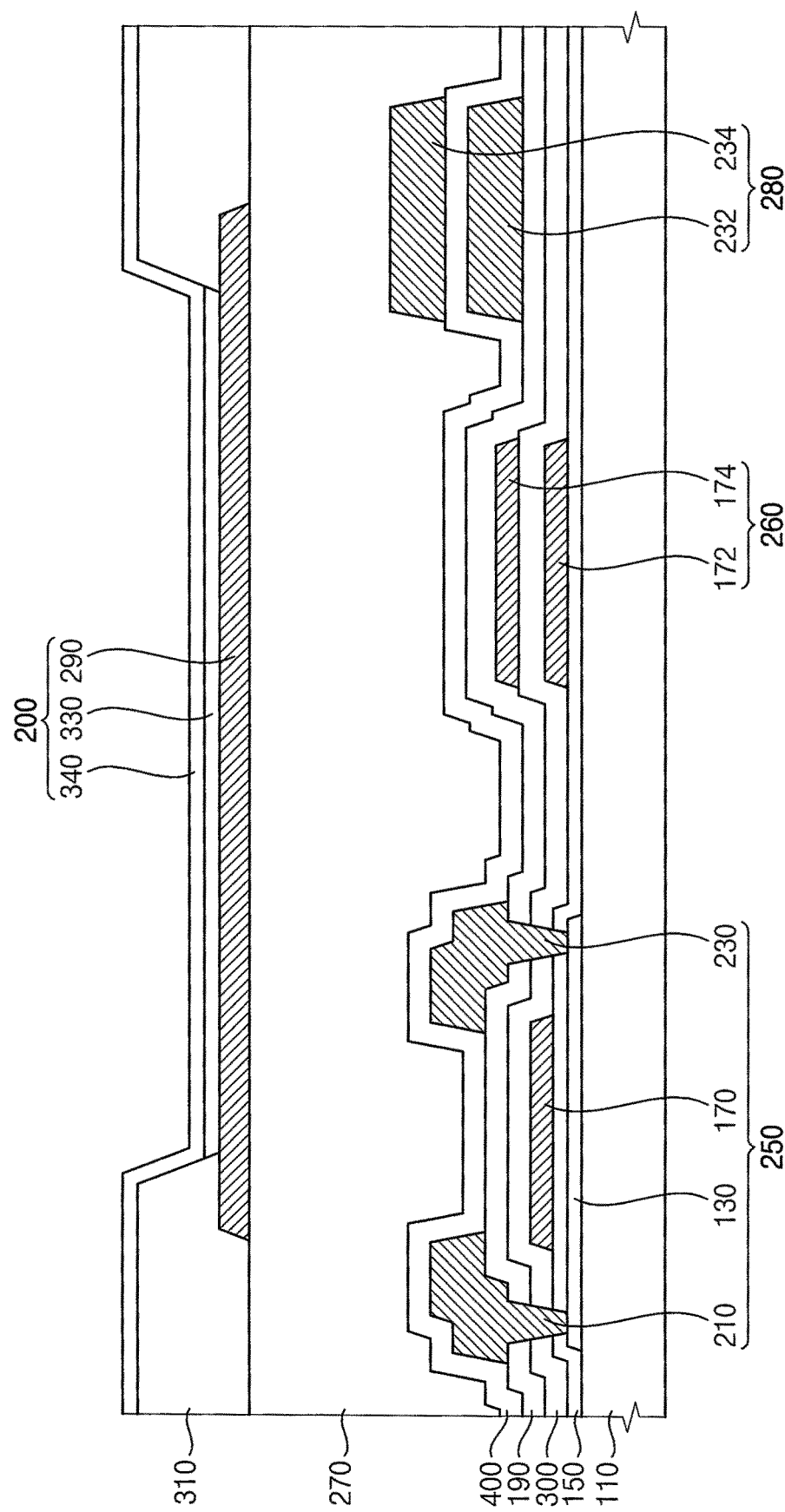

Referring to FIG. 18, a planarization layer 270 may be formed on the second high-k insulation structure 400 and the second electrode pattern 234. The planarization layer 270 may cover the second electrode pattern 234 on the second high-k insulation structure 400 and may be formed on the entire second high-k insulation structure 400. In an exemplary embodiment, for example, the planarization layer 270 may be formed with a high thickness to sufficiently cover the second electrode pattern 234 on the second high-k insulation structure 400. In this case, the planarization layer 270 may have a substantially flat upper surface, and a planarization process may be further performed on the planarization layer 270 to implement the flat upper surface of the planarization layer 270. The planarization layer 270 may be formed using organic materials or inorganic materials. In some exemplary embodiments, the planarization layer 270 may include organic materials such as an epoxy-based resin, an acryl-based resin, photoresist, a polyacryl-based resin, a polyimide-based resin, a polyamide-based resin, a siloxane-based resin, etc.

A lower electrode 290 may be formed on the planarization layer 270. In some exemplary embodiments, the lower electrode 290 may be formed on a portion of the planarization layer 270 under which the semiconductor element 250 is located and may be in contact with the drain electrode 230 via contact hole (not shown) defined by removing a portion of the planarization layer 270. In addition, the lower electrode 290 may be electrically connected to the semiconductor element 250. In an exemplary embodiment, the lower electrode 290 may be formed using a metal, a metal alloy, metal nitride, conductive metal oxide, transparent conductive materials, etc. These materials may be used alone or in a suitable combination thereof. In some exemplary embodiments, the lower electrode 290 may have a multi-layered structure.

A pixel defining layer 310 may be formed on a portion of the lower electrode 290 and the planarization layer 270. That is, the pixel defining layer 310 may cover both lateral portions of the lower electrode 290, and a portion of the lower electrode 290 is exposed from the pixel defining layer 310. The pixel defining layer 310 may be formed using organic materials or inorganic materials. In some exemplary embodiments, the pixel defining layer 310 may include organic materials.

A light emitting layer 330 may be formed on a portion of the lower electrode 290 not covered by the pixel defining layer 310. The light emitting layer 330 may be formed using at least one of light emitting materials capable of generating different colors of light (e.g., a red color of light, a blue color of light, and a green color of light, etc.) according to sub-pixels. Alternatively, the light emitting layer 330 may generally generate a white color of light by stacking a plurality of light emitting materials capable of generating different colors of light such as a red color of light, a green color of light, a blue color of light, etc. In this case, a color filter may be formed on the light emitting layer 330. For example, the color filter may overlap the light emitting layer 330 on a lower surface of an encapsulation substrate. The color filter may include at least one-color filter selected from a red color filter, a green color filter, and a blue color filter. Alternatively, the color filter may include a yellow color filter, a cyan color filter, and a magenta color filter. The color filter may be formed using a photosensitive resin, etc.

An upper electrode 340 may be formed on the pixel defining layer 310 and the light emitting layer 330. The upper electrode 340 may cover the light emitting layer 330 and the pixel defining layer 310, may be formed on the entire light emitting layer 330 and the entire pixel defining layer 310. In an exemplary embodiment, the upper electrode 340 may be formed using a metal, a metal alloy, metal nitride, conductive metal oxide, transparent conductive materials, etc. These materials may be used alone or in a suitable combination thereof. Alternatively, the upper electrode 340 may have a multi-layered structure. Accordingly, a light emitting structure 200 including the lower electrode 290, the light emitting layer 330, and the upper electrode 340 may be formed, and an OLED device 100 illustrated in FIG. 1 may be manufactured as a result.

Figure 19:
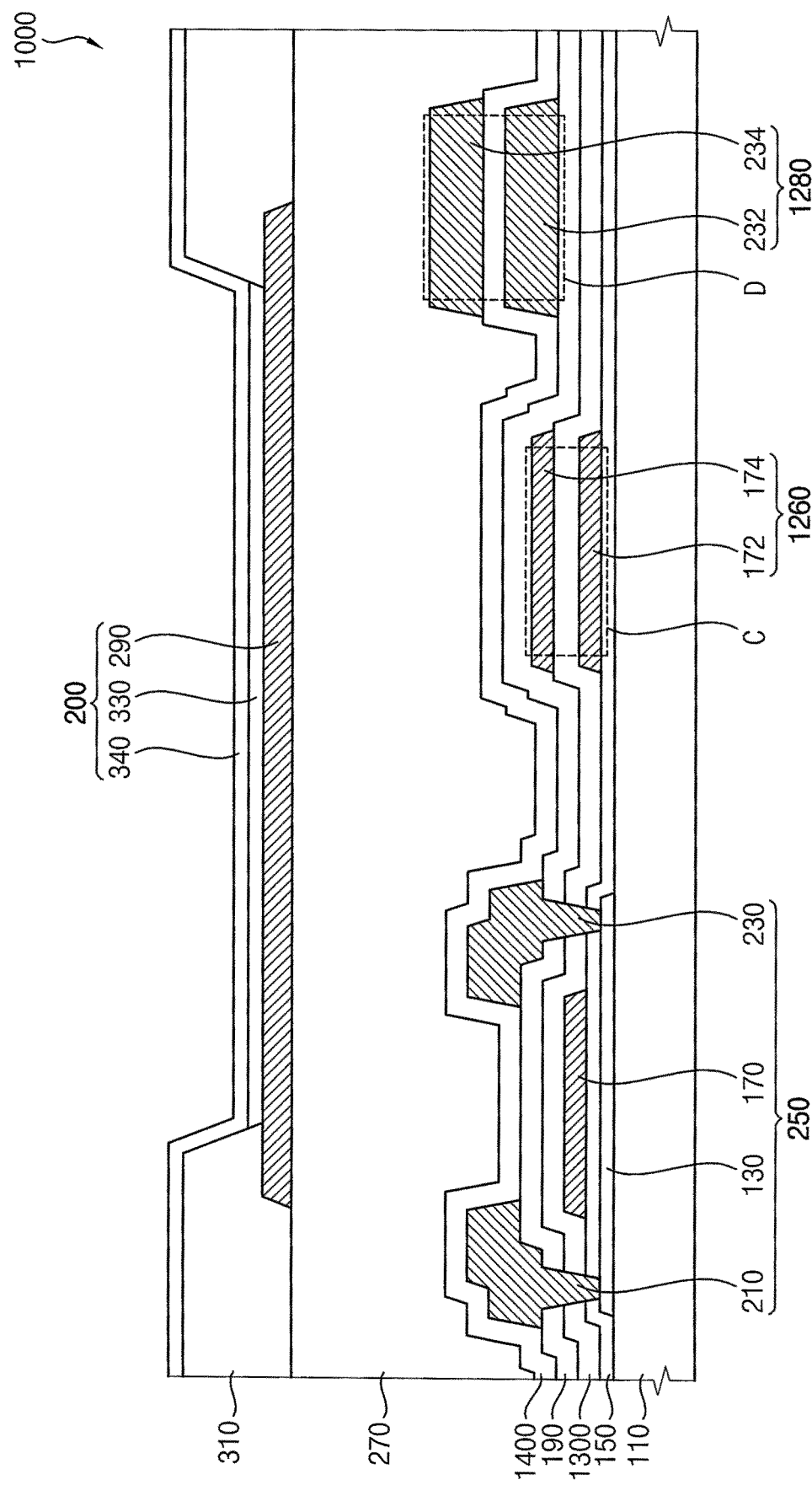
FIG. 19 is a cross-sectional view illustrating another exemplary embodiment of an OLED device in accordance with the invention.
Figure 20:
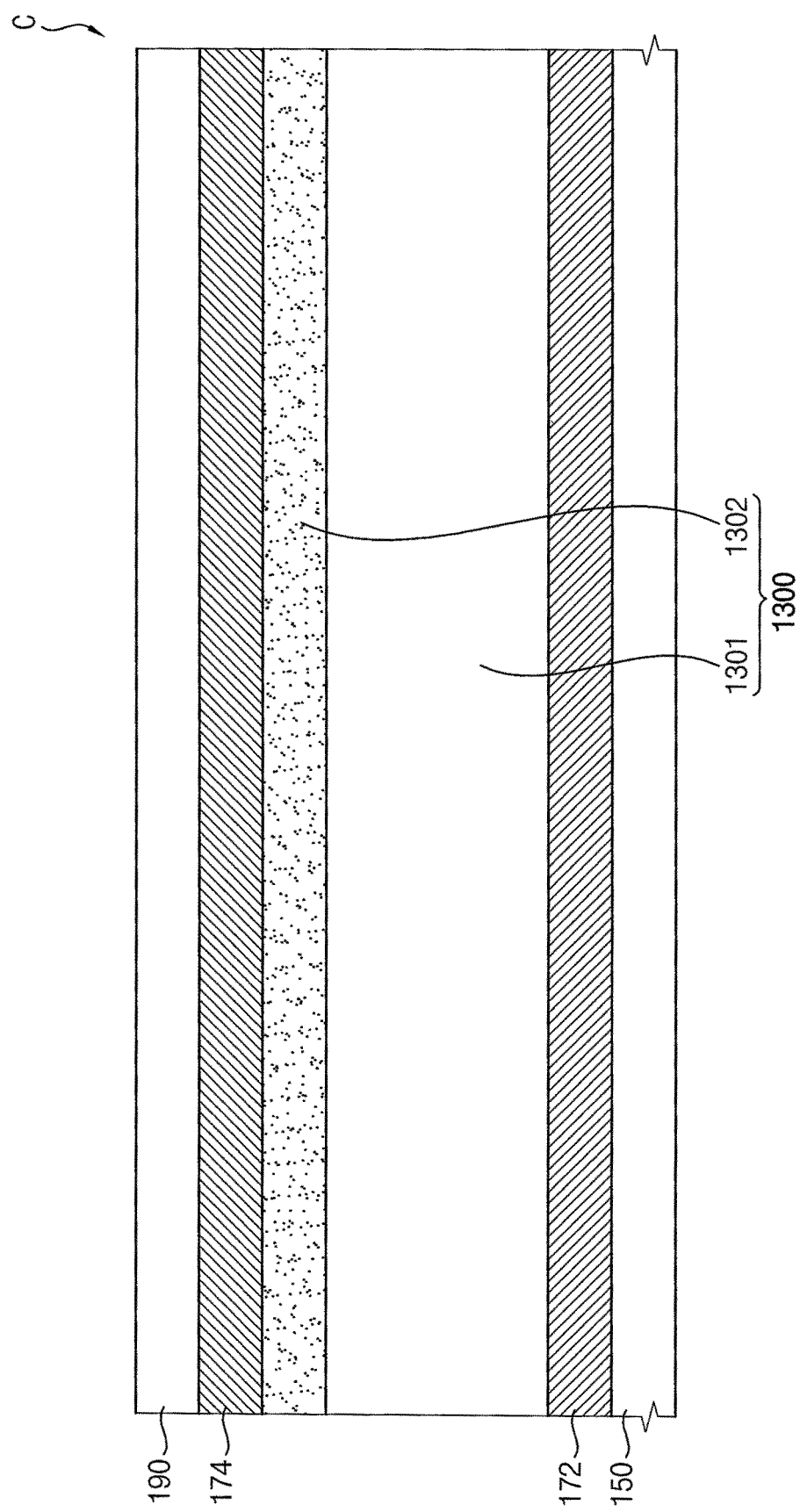
FIG. 20 is an enlarged cross-sectional view corresponding to region 'C' of FIG. 19.

FIG. 19 is a cross-sectional view illustrating another exemplary embodiment of an OLED device in accordance with the invention, and FIG. 20 is an enlarged cross-sectional view corresponding to region 'C' of FIG. 19. FIG. 21 is an enlarged cross-sectional view corresponding to region 'D' of FIG. 19. An OLED device 1000 illustrated in FIGS. 19, 20, and 21 may have a configuration substantially the same as or similar to that of an OLED device 100 described with reference to FIGS. 1, 2, and 3 except for a first high-k insulation structure 1300 and a second high-k insulation structure 1400. In FIGS. 19, 20, and 21, detailed descriptions for elements that are substantially the same as or similar to elements described with reference to FIGS. 1, 2, and 3 may not be repeated.

Referring to FIGS. 19, 20, and 21, an OLED device 1000 may include a substrate 110, a semiconductor element 250, a first capacitor 1260, a second capacitor 1280, a gate insulation layer 150, a first high-k insulation structure 1300, an insulating interlayer 190, a second high-k insulation structure 1400, a planarization layer 270, a pixel defining layer 310, a light emitting structure 200, etc. Here, the semiconductor element 250 may include an active layer 130, a gate electrode 170, a source electrode 210, and a drain electrode 230, and the light emitting structure 200 may include a lower electrode 290, a light emitting layer 330, and an upper electrode 340. In addition, the first capacitor 1260 may include a first gate electrode pattern 172 and a second gate electrode pattern 174, and the second capacitor 1280 may include a first electrode pattern 232 and a second electrode pattern 234. Further, the first high-k insulation structure 1300 may include a carbon-doped first high-k insulation layer 1301 and a first insulation layer 1302, and the second high-k insulation structure 1400 may include a carbon-doped second high-k insulation layer 1401 and a second insulation layer 1402. Since the OLED device 1000 includes the first high-k insulation structure 1300 and the second high-k insulation structure 1400, the OLED device 100 may serve as an OLED device including a dielectric layer of a capacitor having a high dielectric constant and a relatively large thickness. Here, the term 'high dielectric constant' means that the dielectric constant K is 8 or more.

The first high-k insulation structure 1300 may be disposed on the gate insulation layer 150, the gate electrode 170, and the first gate electrode pattern 172. The first high-k insulation structure 1300 may cover the gate electrode 170 and the first gate electrode pattern 172 on the gate insulation layer 150 and may be disposed on the entire gate insulation layer 150. In an exemplary embodiment, for example, the first high-k insulation structure 1300 may cover the gate electrode 170 and the first gate electrode pattern 172 on the gate insulation layer 150 and may be disposed with a substantially uniform thickness along a profile of the gate electrode 170 and the first gate electrode pattern 172. Alternatively, the first high-k insulation structure 1300 may sufficiently cover the gate electrode 170 and the first gate electrode pattern 172 on the gate insulation layer 150 and may have a substantially flat upper surface without a step around the gate electrode 170 and the first gate electrode pattern 172.

In some exemplary embodiments, the first high-k insulation structure 1300 may include the carbon-doped first high-k insulation layer 1301 and the first insulation layer 1302. As illustrated in FIG. 20, the carbon-doped first high-k insulation layer 1301 may be disposed on the first gate electrode pattern 172, and the first insulation layer 1302 may be disposed on the carbon-doped first high-k insulation layer 1301. In some exemplary embodiments, a thickness of the carbon-doped first high-k insulation layer 1301 may be greater than a thickness of the first insulation layer 1302. The carbon-doped first high-k insulation layer 1301 may include a carbon-doped amorphous metal oxide. In an exemplary embodiment, for example, the carbon-doped first high-k insulation layer 1301 may include a carbon-doped AlxOy, a carbon-doped ZrOx, a carbon-doped HfOx, etc. In some exemplary embodiments, the carbon-doped first high-k insulation layer 1301 may consist essentially of a carbon-doped amorphous zirconium oxide. A dielectric constant of the first insulation layer 1302 may be less than a dielectric constant of the carbon-doped first high-k insulation layer 1301. The first insulation layer 1302 may include silicon oxide, silicon nitride, etc.

In some exemplary embodiments, in a process (e.g., ALD process) for forming the first high-k insulation structure 1300, a zirconium oxide may be formed on the gate insulation layer 150, the gate electrode 170, and the first gate electrode pattern 172 by supplying an excess amount of zirconium as a precursor. In this case, the zirconium oxide having a relatively large amount of carbon may be formed, and a crystallization of a carbon-doped zirconium oxide may be suppressed. In other words, the carbon-doped amorphous zirconium oxide may be obtained. After the carbon-doped zirconium oxide is formed, silicon nitride having a relatively low dielectric constant may be formed on the carbon-doped zirconium oxide.

In an exemplary embodiment, for example, compared to the first high-k insulation structure 300 included in an OLED device 100 of FIG. 1, the first high-k insulation structure 1300 may have a relatively high breakdown voltage, and may relatively reduce a leakage current more (refer to FIG. 1). In this case, although a wiring where a high voltage is applied is disposed around the first capacitor 1260, the first capacitor 1260 may be relatively less affected by the high voltage. In other words, the first high-k insulation structure 300 of FIG. 1 or the first high-k insulation structure 1300 of FIG. 19 may be selectively applied as a dielectric layer of the capacitor depending on the surrounding environment of a capacitor. In addition, to further reduce the leakage current, the first insulation layer 1302 having a relatively low dielectric constant may be disposed on the carbon-doped first high-k insulation layer 1301. Accordingly, the first high-k insulation structure 1300 having a relatively high breakdown voltage and a relatively large thickness may be formed.

The second high-k insulation structure 1400 may be disposed on the first electrode pattern 232 and the source and drain electrodes 210 and 230. The second high-k insulation structure 1400 may cover the first electrode pattern 232 and the source and drain electrodes 210 and 230 on the insulating interlayer 190 and may be disposed on the entire insulating interlayer 190. In an exemplary embodiment, for example, the second high-k insulation structure 1400 may cover the first electrode pattern 232 and the source and drain electrodes 210 and 230 on the insulating interlayer 190 and may be disposed with a substantially uniform thickness along a profile of the first electrode pattern 232 and the source and drain electrodes 210 and 230. Alternatively, the second high-k insulation structure 1400 may sufficiently cover the first electrode pattern 232 and the source and drain electrodes 210 and 230 on the insulating interlayer 190 and may have a substantially flat upper surface without a step around the first electrode pattern 232 and the source and drain electrodes 210 and 230.

In some exemplary embodiments, the second high-k insulation structure 1400 may include the carbon-doped second high-k insulation layer 1401 and the second insulation layer 1402. As illustrated in FIG. 21, the carbon-doped second high-k insulation layer 1401 may be disposed on the first electrode pattern 232, and the second insulation layer 1402 may be disposed on the carbon-doped second high-k insulation layer 1401. In some exemplary embodiments, a thickness of the carbon-doped second high-k insulation layer 1401 may be greater than a thickness of the second insulation layer 1402. The carbon-doped second high-k insulation layer 1401 may include a carbon-doped amorphous metal oxide. In an exemplary embodiment, for example, the carbon-doped second high-k insulation layer 1401 may include a carbon-doped AlxOy, a carbon-doped ZrOx, a carbon-doped HfOx, etc. In some exemplary embodiments, the carbon-doped second high-k insulation layer 1401 may consist essentially of a carbon-doped amorphous zirconium oxide. A dielectric constant of the second insulation layer 1402 may be less than a dielectric constant of the carbon-doped second high-k insulation layer 1401. In an exemplary embodiment, the second insulation layer 1402 may include silicon oxide, silicon nitride, etc.

In some exemplary embodiments, in a process (e.g., ALD process) for forming the second high-k insulation structure 1400, a zirconium oxide may be formed on the insulating interlayer 190, the first electrode pattern 232 and the source and drain electrodes 210 and 230 by supplying an excess amount of zirconium as a precursor. In this case, the zirconium oxide having a relatively large amount of carbon may be formed, and a crystallization of a carbon-doped zirconium oxide may be suppressed. In other words, the carbon-doped amorphous zirconium oxide may be obtained. After the carbon-doped zirconium oxide is formed, silicon nitride having a relatively low dielectric constant may be formed on the carbon-doped zirconium oxide.

In an exemplary embodiment, for example, compared to a second high-k insulation structure 400 included in the OLED device 100 of FIG. 1, the second high-k insulation structure 1400 may have a relatively high breakdown voltage, and may relatively reduce a leakage current more (refer to FIG. 1). In this case, although a wiring where a high voltage is applied is disposed around the second capacitor 1280, the second capacitor 1280 may be relatively less affected by the high voltage. In other words, the second high-k insulation structure 400 of FIG. 1 or the second high-k insulation structure 1400 of FIG. 19 may be selectively applied as a dielectric layer of the capacitor depending on the surrounding environment of a capacitor. In addition, to further reduce the leakage current, the second insulation layer 1402 having a relatively low dielectric constant may be disposed on the carbon-doped second high-k insulation layer 1401. Accordingly, the second high-k insulation structure 1400 having a relatively high breakdown voltage and a relatively large thickness may be formed.

Since the OLED device 1000 in accordance with the invention includes the first and second high-k insulation structures 1300 and 1400 having a relatively high breakdown voltage and a relatively large thickness, the first and second capacitors 1260 and 1280 may be relatively less affected by the high voltage, although a wiring where a high voltage is applied is disposed around the first and second capacitors 1260 and 1280.

The invention may be applied to various display devices including an organic light emitting display device. In an exemplary embodiment, for example, the invention may be applied to vehicle-display device, a ship-display device, an aircraft-display device, portable communication devices, display devices for display or for information transfer, a medical-display device, etc.

The foregoing is illustrative of exemplary embodiments and is not to be construed as limiting thereof. Although a few exemplary embodiments have been described, those skilled in the art will readily appreciate that many modifications are possible in the exemplary embodiments disclosed above without materially departing from the novel teachings and advantages of the inventive concept. Accordingly, all such modifications are intended to be included within the scope of the inventive concept as defined in the claims. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. An organic light emitting display (OLED) device comprising:
   a substrate;
   an active layer on the substrate;
   a gate electrode on the active layer;
   a first-high dielectric constant insulation structure on the gate electrode, the first-high dielectric constant insulation structure including:
     a carbon-doped first-high dielectric constant insulation layer; and
     a first ammonia layer on the carbon-doped first-high dielectric constant insulation layer;
   source and drain electrodes on the first-high dielectric constant insulation structure, the source and drain electrode constituting a semiconductor element together with the active layer and the gate electrode; and
   a light emitting structure on the source and drain electrodes.

2. The OLED device of claim 1, wherein the first-high dielectric constant insulation structure has a multi-layered structure including at least two of the carbon-doped first-high dielectric constant insulation layers and at least two of the first ammonia layers.

3. The OLED device of claim 2, wherein the carbon-doped first-high dielectric constant insulation layer and the first ammonia layer are alternately and repeatedly disposed.

4. The OLED device of claim 1, wherein a thickness of the carbon-doped first-high dielectric constant insulation layer is greater than a thickness of the first ammonia layer.

5. The OLED device of claim 1, wherein a thickness of the first-high dielectric constant insulation structure is equal to or greater than about 100 nanometers, and a thickness of the first ammonia layer is less than or equal to about 20 nanometers.

6. The OLED device of claim 1, wherein the carbon-doped first-high dielectric constant insulation layer includes a carbon-doped amorphous metal oxide.

7. The OLED device of claim 6, wherein the carbon-doped first-high dielectric constant insulation layer consists essentially of a carbon-doped amorphous zirconium oxide.

8. The OLED device of claim 1, further comprising:
   a first gate electrode pattern spaced apart from the gate electrode, the first gate electrode pattern being disposed at the same level with the gate electrode; and
   a second gate electrode pattern which overlaps the first gate electrode pattern in a plan view, the second gate electrode pattern constituting a first capacitor together with the first gate electrode pattern and the first-high dielectric constant insulation structure.

9. The OLED device of claim 8, wherein the first-high dielectric constant insulation structure is disposed between the first and second gate electrode patterns.

10. The OLED device of claim 8, further comprising:
    a gate insulation layer disposed between the active layer and the gate electrode; and
    an insulating interlayer disposed on the second gate electrode pattern.

11. The OLED device of claim 1, further comprising:
    a first electrode pattern spaced apart from the source and drain electrodes, the first electrode pattern being disposed at the same level with the source and drain electrodes;
    a second electrode pattern which overlaps the first electrode pattern in a plan view; and
    a second-high dielectric constant insulation structure disposed between the first and second electrode patterns, the second-high dielectric constant insulation structure including:
      a carbon-doped second-high dielectric constant insulation layer; and
      a second ammonia layer disposed on the carbon-doped second-high dielectric constant insulation layer,
    wherein the second electrode pattern constitutes a second capacitor together with the first electrode pattern and the second-high dielectric constant insulation structure.

12. The OLED device of claim 11, wherein the second-high dielectric constant insulation structure has a multi-layered structure including at least two of the carbon-doped second-high dielectric constant insulation layers and at least two of the second ammonia layers, and
    wherein the carbon-doped second-high dielectric constant insulation layer and the second ammonia layer are alternately and repeatedly disposed.

13. The OLED device of claim 11, wherein a thickness of the carbon-doped second-high dielectric constant insulation layer is greater than a thickness of the second ammonia layer, and the carbon-doped second-high dielectric constant insulation layer consists essentially of a carbon-doped amorphous zirconium oxide.

14. The OLED device of claim 1, wherein the light emitting structure includes:
   a lower electrode disposed on the semiconductor element;
   a light emitting layer disposed on the lower electrode; and
   an upper electrode disposed on the light emitting layer.

15. An organic light emitting display (OLED) device comprising:
   a substrate;
   an active layer on the substrate;
   a gate electrode on the active layer;
   a first-high dielectric constant insulation structure on the gate electrode, the first-high dielectric constant insulation structure including:
      a carbon-doped first-high dielectric constant insulation layer covering an entire top surface defining the gate electrode; and
      a first insulation layer on the carbon-doped first-high dielectric constant insulation layer, the first insulation layer having a dielectric constant less than a dielectric constant of the carbon-doped first-high dielectric constant insulation layer;
   source and drain electrodes on the first-high dielectric constant insulation structure, the source and drain electrode constituting a semiconductor element together with the active layer and the gate electrode; and
   a light emitting structure on the source and drain electrodes.

16. The OLED device of claim 15, wherein a thickness of the carbon-doped first-high dielectric constant insulation layer is greater than a thickness of the first insulation layer.

17. The OLED device of claim 15, wherein the carbon-doped first-high dielectric constant insulation layer consists essentially of a carbon-doped amorphous zirconium oxide.

18. The OLED device of claim 15, further comprising:
   a first electrode pattern spaced apart from the source and drain electrodes, the first electrode pattern being disposed at the same level with the source and drain electrodes;
   a second electrode pattern which overlaps the first electrode pattern in a plan view; and
   a second-high dielectric constant insulation structure disposed between the first and second electrode patterns, the second-high dielectric constant insulation structure including:
      a carbon-doped second-high dielectric constant insulation layer; and
      a second insulation layer disposed on the carbon-doped second-high dielectric constant insulation layer, the second insulation layer having a dielectric constant less than a dielectric constant of carbon-doped second-high dielectric constant insulation layer,
   wherein the second electrode pattern constitutes a second capacitor together with the first electrode pattern and the second-high dielectric constant insulation structure.

19. An organic light emitting display (OLED) device comprising:
   a substrate;
   an active layer on the substrate;
   a gate electrode on the active layer;
   a first-high dielectric constant insulation structure on the gate electrode, the first-high dielectric constant insulation structure including:
      a carbon-doped first-high dielectric constant insulation layer; and
      a first insulation layer on the carbon-doped first-high dielectric constant insulation layer, the first insulation layer having a dielectric constant less than a dielectric constant of the carbon-doped first-high dielectric constant insulation layer;
   source and drain electrodes on the first-high dielectric constant insulation structure, the source and drain electrode constituting a semiconductor element together with the active layer and the gate electrode;
   a light emitting structure on the source and drain electrodes;
   a first gate electrode pattern spaced apart from the gate electrode, the first gate electrode pattern being disposed at the same level with the gate electrode; and
   a second gate electrode pattern which overlaps the first gate electrode pattern in a plan view, the second gate electrode pattern constituting a first capacitor together with the first gate electrode pattern and the first-high dielectric constant insulation structure,
   wherein the first-high dielectric constant insulation structure is disposed between the first and second gate electrode patterns.

20. The OLED device of claim 19, further comprising:
   a gate insulation layer disposed between the active layer and the gate electrode; and
   an insulating interlayer disposed on the second gate electrode pattern.

* * * * *